US012713713B2

(12) United States Patent
Rehder

(10) Patent No.: US 12,713,713 B2
(45) Date of Patent: Aug. 18, 2026

(54) SPACE SOLAR CELL ARRAY WITH CUSTOM VOLTAGE

(71) Applicant: The Boeing Company, Chicago, IL (US)

(72) Inventor: Eric Rehder, Los Angeles, CA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 17/100,823

(22) Filed: Nov. 21, 2020

(65) Prior Publication Data

US 2022/0165899 A1 May 26, 2022

(51) Int. Cl.
*H10F 19/90* (2025.01)

(52) U.S. Cl.
CPC .................................. *H10F 19/902* (2025.01)

(58) Field of Classification Search
CPC .......... H02S 40/36; H02S 40/34; H02S 40/32; H01L 31/05; H01L 31/0504; H10F 19/90; H10F 19/902; H10F 19/904; H10F 19/906; H10F 19/80; H10F 77/211
See application file for complete search history.

(56) References Cited

U.S. PATENT DOCUMENTS 3,376,164 A 4/1968 Bachwansky
3,833,426 A 9/1974 Mesch
4,057,439 A 11/1977 Lindmayer
4,257,821 A 3/1981 Kelly et al.
4,481,378 A 11/1984 Lesk
4,755,231 A 7/1988 Kurland et al.
5,330,583 A 7/1994 Asai et al.
5,567,248 A 10/1996 Chung
6,008,448 A 12/1999 Peck
6,313,396 B1 * 11/2001 Glenn ................ H01L 31/0512
136/251
6,350,944 B1 2/2002 Sherif et al.
6,441,297 B1 8/2002 Keller et al.
6,543,725 B1 4/2003 Meurer et al.
6,555,739 B2 4/2003 Kawam (Continued)

FOREIGN PATENT DOCUMENTS

CN 103155158 A 6/2013
CN 203277428 U 11/2013

(Continued)

OTHER PUBLICATIONS

Final Office Action dated Feb. 24, 2022 for U.S. Appl. No. 15/643,277.

(Continued)

*Primary Examiner* — Christina Chern
(74) *Attorney, Agent, or Firm* — MH2 Technology Law Group LLP

(57) ABSTRACT

A solar cell array comprised of one or more solar cells attached to a substrate, such as a pre-fabricated flex circuit, wherein: the substrate includes one or more insulating layers and one or more conductive layers patterned as one or more conductors for making electrical connections with the solar cells; and the substrate includes one or more decision points for removing or adding electrical continuity to the conductors, for customizing circuits of the solar cells to a desired dimension of the solar cells and a desired output voltage.

19 Claims, 26 Drawing Sheets

(56) References Cited

U.S. PATENT DOCUMENTS

| | | | | |
|---|---|---|---|---|
| 6,637,702 | B1 | 10/2003 | McCandless | |
| 8,814,099 | B1 | 8/2014 | Harvey et al. | |
| 9,120,583 | B1 | 9/2015 | Spence et al. | |
| 9,758,261 | B1 | 9/2017 | Steinfeldt | |
| 2003/0057533 | A1 | 3/2003 | Lemmi et al. | |
| 2004/0118446 | A1 | 6/2004 | Toyomura | |
| 2005/0133079 | A1 | 6/2005 | Boulanger et al. | |
| 2006/0170435 | A1 | 8/2006 | Granicher et al. | |
| 2007/0005843 | A1 | 1/2007 | Sim et al. | |
| 2007/0152194 | A1 | 7/2007 | Natekar et al. | |
| 2008/0295889 | A1 | 12/2008 | Schindler et al. | |
| 2009/0183760 | A1 | 7/2009 | Meyer | |
| 2009/0255571 | A1 | 10/2009 | Xia et al. | |
| 2009/0272436 | A1 | 11/2009 | Cheung | |
| 2009/0301544 | A1* | 12/2009 | Minelli | H05K 3/305 257/E31.119 |
| 2010/0012172 | A1 | 1/2010 | Meakin et al. | |
| 2010/0089435 | A1 | 4/2010 | Lockenhoff | |
| 2010/0126560 | A1 | 5/2010 | Lauvray et al. | |
| 2010/0186795 | A1 | 7/2010 | Gaul | |
| 2010/0212741 | A1 | 8/2010 | Lin | |
| 2010/0223864 | A1* | 9/2010 | Dube | H02S 20/25 52/173.3 |
| 2011/0041890 | A1 | 2/2011 | Sheats | |
| 2011/0073163 | A1 | 3/2011 | Cheung | |
| 2011/0079263 | A1 | 4/2011 | Avrutsky | |
| 2011/0168238 | A1 | 7/2011 | Metin et al. | |
| 2011/0198444 | A1 | 8/2011 | Dong | |
| 2012/0103388 | A1 | 5/2012 | Meakin et al. | |
| 2012/0161801 | A1 | 6/2012 | Hasegawa | |
| 2012/0199176 | A1 | 8/2012 | Hong et al. | |
| 2012/0222728 | A1 | 9/2012 | Nakanishi et al. | |
| 2012/0313455 | A1 | 12/2012 | Atham | |
| 2013/0014802 | A1 | 1/2013 | Zimmerman | |
| 2013/0056047 | A1 | 3/2013 | Beck et al. | |
| 2013/0263915 | A1 | 10/2013 | Snidow | |
| 2014/0000682 | A1 | 1/2014 | Zhao | |
| 2014/0033625 | A1 | 2/2014 | Jenkins et al. | |
| 2014/0083497 | A1 | 3/2014 | Ehrenpfordt et al. | |
| 2014/0166067 | A1 | 6/2014 | McGlynn et al. | |
| 2014/0255780 | A1 | 9/2014 | Mikhaylik et al. | |
| 2014/0366927 | A1 | 12/2014 | Lavrova et al. | |
| 2015/0083191 | A1 | 3/2015 | Gmundner | |
| 2015/0096607 | A1 | 4/2015 | Yong | |
| 2015/0144173 | A1 | 5/2015 | Hoang et al. | |
| 2015/0287862 | A1 | 10/2015 | Pardell Vilella | |
| 2015/0349703 | A1 | 12/2015 | Morad et al. | |
| 2016/0112004 | A1 | 4/2016 | Thiel et al. | |
| 2016/0126380 | A1 | 5/2016 | Chang | |
| 2016/0197207 | A1 | 7/2016 | Morioka et al. | |
| 2016/0218665 | A1 | 7/2016 | Crist | |
| 2017/0040933 | A1 | 2/2017 | Vogel | |
| 2017/0054406 | A1 | 2/2017 | Narla et al. | |
| 2017/0098736 | A1 | 4/2017 | Lee et al. | |
| 2017/0163212 | A1 | 6/2017 | France et al. | |
| 2017/0229692 | A1 | 8/2017 | Thiel et al. | |
| 2017/0374737 | A1 | 12/2017 | Jeong et al. | |
| 2018/0076339 | A1 | 3/2018 | Rehder | |
| 2018/0076350 | A1 | 3/2018 | Rehder et al. | |
| 2018/0358491 | A1 | 12/2018 | Rehder | |
| 2018/0358497 | A1 | 12/2018 | Rehder | |
| 2019/0127089 | A1 | 5/2019 | Tomoda et al. | |
| 2019/0140584 | A1 | 5/2019 | Hayashi et al. | |
| 2019/0379322 | A1 | 12/2019 | Britt | |

FOREIGN PATENT DOCUMENTS

| | | | | |
|---|---|---|---|---|
| CN | 104241406 | A | 12/2014 | |
| CN | 104443439 | A | 3/2015 | |
| DE | 10136442 | | 2/2003 | |
| DE | 10136442 | A1 | 2/2003 | |
| EP | 1548 847 | | 6/2005 | |
| EP | 3297032 | A1 * | 3/2018 | H10F 10/142 |
| EP | 3297035 | A1 | 3/2018 | |
| JP | 2001284609 | A | 10/2001 | |
| JP | 2002190612 | | 7/2002 | |
| JP | 2002190612 | A | 7/2002 | |
| JP | 2011071214 | | 4/2011 | |
| JP | 2012043981 | A | 3/2012 | |
| JP | 2012074685 | A | 4/2012 | |
| JP | 2012204651 | A | 10/2012 | |
| JP | 2013048166 | A | 3/2013 | |
| KR | 101883758 | B1 | 8/2018 | |

OTHER PUBLICATIONS

Non-Final Office Action dated Aug. 18, 2021 for U.S. Appl. No. 15/643,285.

Non-Final Office Action dated Aug. 18, 2021 for U.S. Appl. No. 15/787,291.

Non-Final Office Action dated Aug. 18, 2021 for U.S. Appl. No. 15/787,304.

European Examination Communication dated Dec. 1, 2020 for EP Application No. 17191162.1.

Final Office Action dated Jan. 20, 2022 for U.S. Appl. No. 15/643,285.

Final Office Action dated Jun. 3, 2022 for U.S. Appl. No. 15/643,279.

Stern, T., et al., “Modular Solar Panels Using Components Engineered for Producibility”, Photovoltaic Specialists Conference (PVSC), 2011 37th IEEE, Jun. 19-24, 2011, pp. 001626-001629.

Walmsley, N., et al., “Increasing the TRL Level of New PV Technologies Using Modular Solar Panels”, Photovoltaic Specialists Conference (PVSC), 2012 38th IEEE, Jun. 3-8, 2012, pp. 002835-002839.

Final Office Action dated Mar. 12, 2021 for U.S. Appl. No. 15/643,282.

Final Office Action dated Feb. 14, 2022 for U.S. Appl. No. 16/847,359.

Final Office Action dated Dec. 17, 2021 for U.S. Appl. No. 15/787,291.

Final Office Action dated Aug. 13, 2021 for U.S. Appl. No. 15/938,791.

Final Office Action dated Jun. 1, 2021 for U.S. Appl. No. 15/643,277.

Non-Final Office Action dated Dec. 6, 2021 for U.S. Appl. No. 15/643,279.

Non-Final Office Action dated Feb. 18, 2021 for U.S. Appl. No. 15/938,791.

Notice of Allowance dated Apr. 20, 2022 for U.S. Appl. No. 15/643,289.

Final Office Action dated Apr. 22, 2021 for U.S. Appl. No. 15/643,285.

Non-Final Office Action dated Jan. 7, 2021 for U.S. Appl. No. 15/787,291.

Non-Final Office Action dated Dec. 22, 2020 for U.S. Appl. No. 15/643,285.

Final Office Action dated Feb. 11, 2022 for U.S. Appl. No. 16/847,032.

Non-Final Office Action dated Mar. 14, 2022 for U.S. Appl. No. 15/643,282.

Final Office Action dated Dec. 9, 2021 for U.S. Appl. No. 15/938,787.

Extended European Search Report dated Mar. 25, 2022 for European Patent Application No. 21207755.6.

Final Office Action dated Dec. 28, 2021 for U.S. Appl. No. 15/643,282.

Non-Final Office Action dated Apr. 27, 2021 for U.S. Appl. No. 15/938,787.

Final Office Action dated Mar. 5, 2021 for U.S. Appl. No. 15/643,279.

1 Non-Final Office Action dated Aug. 2, 2021 for U.S. Appl. No. 15/643,282.

Non-Final Office Action dated Dec. 7, 20 for U.S. Appl. No. 15/787,304.

Non-Final Office Action dated May 12, 2021 for U.S. Appl. No. 15/643,274.

Final Office Action dated Dec. 15, 2021 for U.S. Appl. No. 15/787,304.

Non-Final Office Action dated Sep. 17, 2021 for U.S. Appl. No. 15/643,277.

Non-Final Office Action dated Sep. 29, 2021 for U.S. Appl. No. 15/643,289.

Non-Final Office Action dated Feb. 1, 2021 for U.S. Appl. No. 15/643,277.

(56) References Cited

OTHER PUBLICATIONS

European Search Report dated Dec. 4, 2017 for EP application No. 17191134.
Notice of Allowance dated Jun. 23, 2022 for U.S. Appl. No. 16/847,359.
Non-Final Office Action dated Jul. 1, 2022 for U.S. Appl. No. 15/643,277.
Final Office Action dated Jan. 15, 2019 for U.S. Appl. No. 15/643,277.
Final Office Action dated Jul. 28, 2020 for U.S. Appl. No. 15/643,277.
Final Office Action dated Oct. 10, 2019 for U.S. Appl. No. 15/643,277.
Non-Final Office Action dated Apr. 30, 2019 for U.S. Appl. No. 15/643,277.
Non-Final Office Action dated Jul. 30, 2018 for U.S. Appl. No. 15/643,277.
Non-Final Office Action dated Mar. 24, 2020 for U.S. Appl. No. 15/643,277.
Non-Final Office Action dated Sep. 23, 2022 for U.S. Appl. No. 16/991,589.
Non-Final Office Action dated Sep. 15, 2022 for U.S. Appl. No. 16/543,279.
Final Office Action dated Aug. 25, 2022 for U.S. Appl. No. 15/643,282.
Non-Final Office Action dated Nov. 14, 2022 for U.S. Appl. No. 15/643,285.
Non-Final Office Action dated Dec. 22, 2022 for U.S. Appl. No. 15/938,787.
Non-Final Office Action dated Dec. 20, 2022 for U.S. Appl. No. 15/643,282.
Non-Final Office Action dated Dec. 23, 2022 for U.S. Appl. No. 17/878,348.
Final Office Action dated Dec. 1, 2022 for U.S. Appl. No. 15/643,277.
Non-Final Office Action dated Apr. 19, 2023 for U.S. Appl. No. 15/787,304.
Final Office Action dated Mar. 31, 2023 for U.S. Appl. No. 15/643,279.
Final Office Action dated Apr. 18, 2023 for U.S. Appl. No. 16/991,589.
Final Office Action dated Jun. 15, 2023 for U.S. Appl. No. 15/643,285.
Final Office Action dated Sep. 11, 2023 for U.S. Appl. No. 15/787,291.
Non-Final Office Action dated Sep. 13, 2023 for U.S. Appl. No. 15/643,279.
Non-Final Office Action dated May 11, 2023 for U.S. Appl. No. 15/643,277.
Final office Action dated Jul. 7, 2023 for U.S. Appl. No. 17/878,348.
Final Office Action dated Jun. 22, 2023 for U.S. Appl. No. 15/938,787.
Final Office Action dated Jun. 27, 2023 for U.S. Appl. No. 15/643,282.
Non-Final Office Action dated Sep. 20, 2023 for U.S. Appl. No. 16/991,589.
Non-Final Office Action dated Sep. 25, 2023 for U.S. Appl. No. 16/847,032.
Non-Final Office Action dated May 5, 2023 for U.S. Appl. No. 15/797,291.
Non-Final Office Action dated Nov. 9, 2023 for U.S. Appl. No. 15/643,282.
Notice of Allowance dated Jan. 24, 2024 for U.S. Appl. No. 16/847,032.
Final Office Action dated Oct. 10, 2023 for U.S. Appl. No. 15/938,791.
Non-Final Office Action dated Jan. 26, 2024 for U.S. Appl. No. 15/787,304.
Final Office Action dated Nov. 15, 2023 for U.S. Appl. No. 15/643,277.
Non-Final Office Action dated Oct. 25, 2023 for U.S. Appl. No. 15/643,274.
Non-Final Office Action dated Oct. 26, 2023 for U.S. Appl. No. 17/878,348.
Non-Final Office Action dated Dec. 27, 2023 for U.S. Appl. No. 15/787,291.
Non-Final Office Action dated Feb. 8, 2024 for U.S. Appl. No. 15/938,791.
Final Office Action dated Mar. 14, 2024 for U.S. Appl. No. 16/991,589.
Final Office Action dated May 10, 2024 for U.S. Appl. No. 15/787,304.
Non-Final Office Action dated May 14, 2024 for U.S. Appl. No. 15/643,277.
Final Office Action dated Mar. 4, 2024 for U.S. Appl. No. 15/643,279.
Non-Final Office Action dated Jun. 18, 2024 for U.S. Appl. No. 15/643,279.
Final Office Action dated Apr. 24, 2024 for U.S. Appl. No. 15/643,274.
Final Office Action dated May 23, 2024 for U.S. Appl. No. 15/643,282.
Final Office Action dated May 24, 2024 for U.S. Appl. No. 15/787,291.
Notice of Reasons for Refusal, dated Nov. 4, 2025, for counterpart Japanese Application No. 2021-188388, 13 pages including English translation.
Examination Report, dated Nov. 4, 2025, for counterpart Indian Application No. 202114052725, 6 pages including English translation.

* cited by examiner

SPACE SOLAR CELL ARRAY WITH CUSTOM VOLTAGE

CROSS REFERENCE TO RELATED APPLICATIONS

This application is related to the following and commonly-assigned applications:

U.S. Utility application Ser. No. 15/643,274, filed on Jul. 6, 2017, by Eric Rehder, entitled "SOLAR CELL ARRAY CONNECTIONS USING CORNER CONDUCTORS,";

U.S. Utility application Ser. No. 15/643,277, filed on Jul. 6, 2017, by Eric Rehder, entitled "PREFABRICATED CONDUCTORS ON A SUBSTRATE TO FACILITATE CORNER CONNECTIONS FOR A SOLAR CELL ARRAY," ;

U.S. Utility application Ser. No. 15/643,279, filed on Jul. 6, 2017, by Eric Rehder, entitled "REWORK AND REPAIR OF COMPONENTS IN A SOLAR ARRAY," ;

U.S. Utility application Ser. No. 15/643,282, filed on Jul. 6, 2017, by Eric Rehder, entitled "POWER ROUTING MODULE FOR A SOLAR ARRAY,";

U.S. Utility application Ser. No. 15/643,285, filed on Jul. 6, 2017, by Eric Rehder, entitled "POWER ROUTING MODULE WITH A SWITCHING MATRIX FOR A SOLAR CELL ARRAY,";

U.S. Utility application Ser. No. 16/991,589, filed on Aug. 12, 2020, by Eric Rehder, entitled "NANO-METAL CONNECTIONS FOR A SOLAR CELL ARRAY,", which is a divisional of U.S. Utility application Ser. No. 15/643,287, filed on Jul. 6, 2017, by Eric Rehder, entitled "NANO-METAL CONNECTIONS FOR A SOLAR CELL ARRAY,", now U.S. Pat. No. 19,763,383, issued Sep. 1, 2020; and U.S. Utility application Ser. No. 15/643,289, filed on Jul. 6, 2017, by Eric Rehder, Philip Chiu, Tom Crocker, Daniel Law and Dale Waterman, entitled "SOLAR CELLS FOR A SOLAR CELL ARRAY,";

all of which applications claim the benefit under 35 U.S.C. Section 119(e) of the following and commonly-assigned provisional applications:

U.S. Provisional Application Ser. No. 62/394,636, filed on Sep. 14, 2016, by Eric Rehder, entitled "SOLAR CELL ARRAY CONNECTIONS,";

U.S. Provisional Application Ser. No. 62/394,616, filed on Sep. 14, 2016, by Eric Rehder, entitled "CORNER CONNECTORS FOR A SOLAR CELL ARRAY,";

U.S. Provisional Application Ser. No. 62/394,623, filed on Sep. 14, 2016, by Eric Rehder, entitled "PREFABRICATED CONDUCTORS ON A SUBSTRATE TO FACILITATE CORNER CONNECTIONS FOR A SOLAR CELL ARRAY,";

U.S. Provisional Application Ser. No. 62/394,627, filed on Sep. 14, 2016, by Eric Rehder, entitled "SELECT CURRENT PATHWAYS IN A SOLAR CELL ARRAY,";

U.S. Provisional Application Ser. No. 62/394,629, filed on Sep. 14, 2016, by Eric Rehder, entitled "MULTILAYER CONDUCTORS IN A SOLAR CELL ARRAY,";

U.S. Provisional Application Ser. No. 62/394,632, filed on Sep. 14, 2016, by Eric Rehder, entitled "REWORK AND REPAIR OF COMPONENTS IN A SOLAR CELL ARRAY,";

U.S. Provisional Application Ser. No. 62/394,649, filed on Sep. 14, 2016, by Eric Rehder, entitled "POWER ROUTING MODULE FOR A SOLAR CELL ARRAY," ;

U.S. Provisional Application Ser. No. 62/394,666, filed on Sep. 14, 2016, by Eric Rehder, entitled "POWER ROUTING MODULE WITH A SWITCHING MATRIX FOR A SOLAR CELL ARRAY,";

U.S. Provisional Application Ser. No. 62/394,667, filed on Sep. 14, 2016, by Eric Rehder, entitled "NANO-METAL CONNECTIONS FOR A SOLAR CELL ARRAY,";

U.S. Provisional Application Ser. No. 62/394,671, filed on Sep. 14, 2016, by Eric Rehder, entitled "BACK CONTACTS FOR A SOLAR CELL ARRAY,";

U.S. Provisional Application Ser. No. 62/394,641, filed on Sep. 14, 2016, by Eric Rehder, entitled "PRINTED CONDUCTORS IN A SOLAR CELL ARRAY,"; and U.S. Provisional Application Ser. No. 62/394,672, filed on Sep. 14, 2016, by Eric Rehder, Philip Chiu, Tom Crocker and Daniel Law, entitled "SOLAR CELLS FOR A SOLAR CELL ARRAY,";

all of which applications are incorporated by reference herein.

This application also is related to the following and commonly-assigned applications:

U.S. Utility application Ser. No. 15/787,291, filed on Oct. 18, 2017, by Eric Rehder, entitled "SOLAR CELL ARRAY WITH CHANGEABLE STRING LENGTH,"; and U.S. Utility application Ser. No. 15/787,304, filed on Oct. 18, 2017, by Eric Rehder, entitled "SOLAR CELL ARRAY WITH BYPASSED SOLAR CELLS,";

both of which applications claim the benefit under 35 U.S.C. Section 119(e) of and commonly-assigned provisional applications:

U.S. Provisional Application Ser. No. 62/518,125, filed on Jun. 12, 2017, by Eric Rehder, entitled "SOLAR CELL ARRAY WITH CHANGEABLE STRING LENGTH,"; and U.S. Provisional Application Ser. No. 62/518,131, filed on Jun. 12, 2017, by Eric Rehder, entitled "SOLAR CELL ARRAY WITH BYPASSED SOLAR CELLS,";

all of which applications are incorporated by reference herein.

In addition, this application also is related to the following and commonly-assigned applications:

U.S. Utility application Ser. No. 15/938,787, filed on Mar. 28, 2018, by Eric Rehder, entitled "SINGLE SHEET FOLDOUT SOLAR ARRAY,"; and U.S. Utility application Ser. No. 15/938,791, filed on Mar. 28, 2018, by Eric Rehder, entitled "WIRING FOR A RIGID PANEL SOLAR ARRAY,";

both of which applications are incorporated by reference herein.

This application also is related to the following and commonly-assigned applications:

U.S. Utility application Ser. No. 16/847,032, filed on Apr. 13, 2020, by Eric Rehder, entitled "SOLAR ARRAY ATTACHMENT,"; and U.S. Utility application Ser. No. 16/847,359, filed on Apr. 13, 2020, by Eric Rehder, entitled "STACKED SOLAR ARRAY,";

both of which applications are incorporated by reference herein.

BACKGROUND INFORMATION

1. Field.

The disclosure is related generally to solar cell panels and more specifically to a space solar cell array with custom voltage.

2. Background.

A typical spaceflight-capable solar cell panel assembly involves building solar cell arrays comprised of long strings of solar cells connected in series. These strings are variable in length, i.e., number of solar cells, and can be very long.

Conventional solar cell arrays are built with a fixed number of solar cells to produce a required output voltage, which is also modified by the operating temperature and radiation dose. For example, a string of 50 solar cells connected in series may produce an output voltage of 100V.

This output voltage needs to meet or exceed a power system's requirements to deliver power. The temperature and radiation dose is fixed by the mission, while the number of solar cells in the circuit is a variable set in order to meet the output voltage of the power system's requirements.

Missions vary and there is a need for a solar cell panel that is tailorable.

SUMMARY

To overcome the limitations described above, and to overcome other limitations that will become apparent upon reading and understanding the present specification, the present disclosure describes a solar cell array, a method of fabricating a solar cell array, and a method of operating a solar cell array. The solar cell array comprises one or more solar cells that are attached to a substrate, such as a pre-fabricated flex circuit, wherein: the substrate includes one or more insulating layers and one or more conductive layers patterned as one or more conductors for making electrical connections with the solar cells; and the substrate includes one or more decision points for removing or adding electrical continuity to the conductors, for customizing circuits of the solar cells to a desired dimension of the solar cells and a desired output voltage.

DRAWINGS

Referring now to the drawings in which like reference numbers represent corresponding parts throughout:

FIGS. 7, 8, 9, 10, 11 and 12 provide detail of each corner region showing conducting pathways in the corner regions and discontinuities made to achieve a 12 cell circuit length for the solar cell panel.

Figure 13:
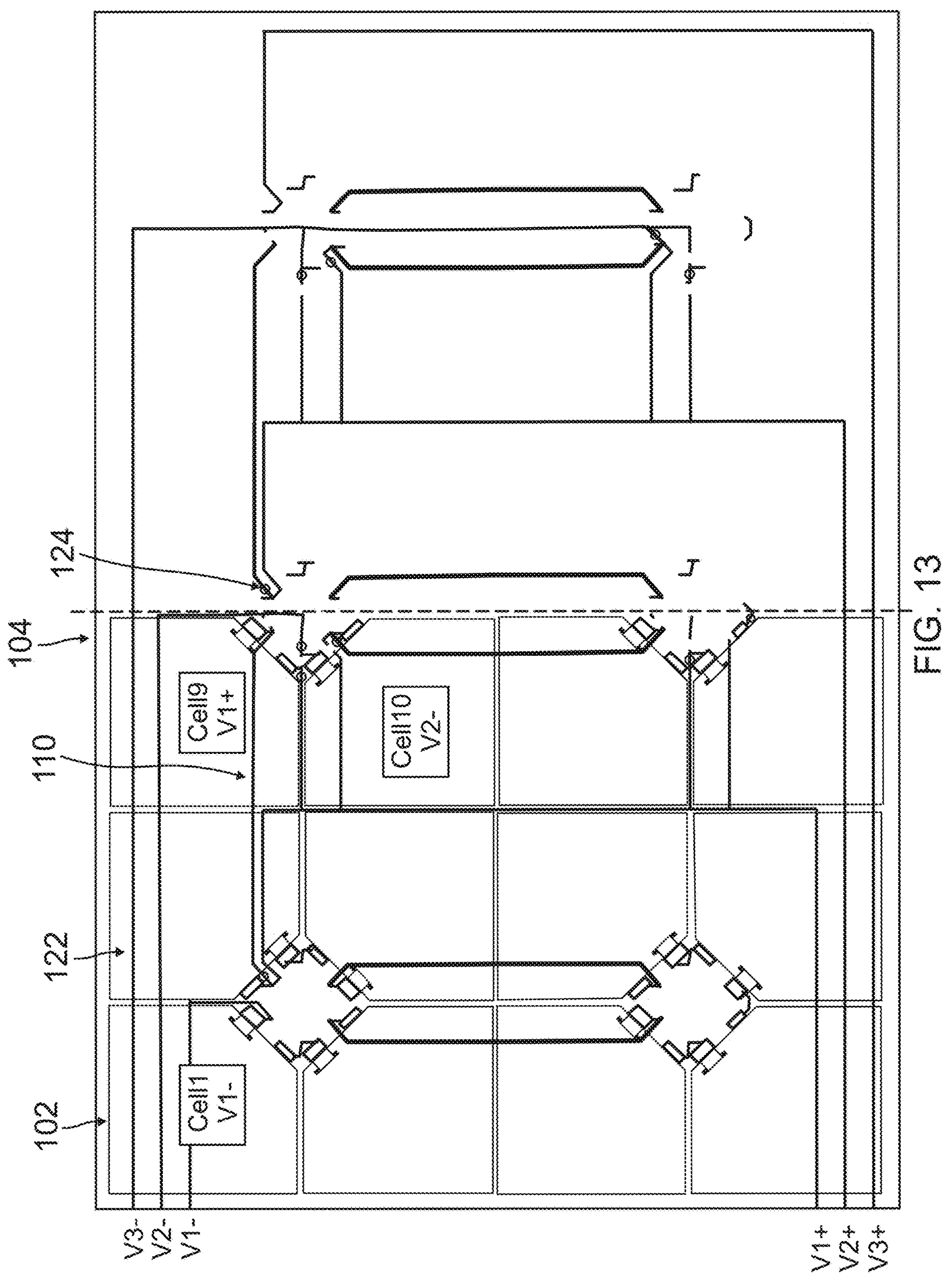

FIG. 13 illustrates how the size of a solar cell array can be customized.

Figure 14:
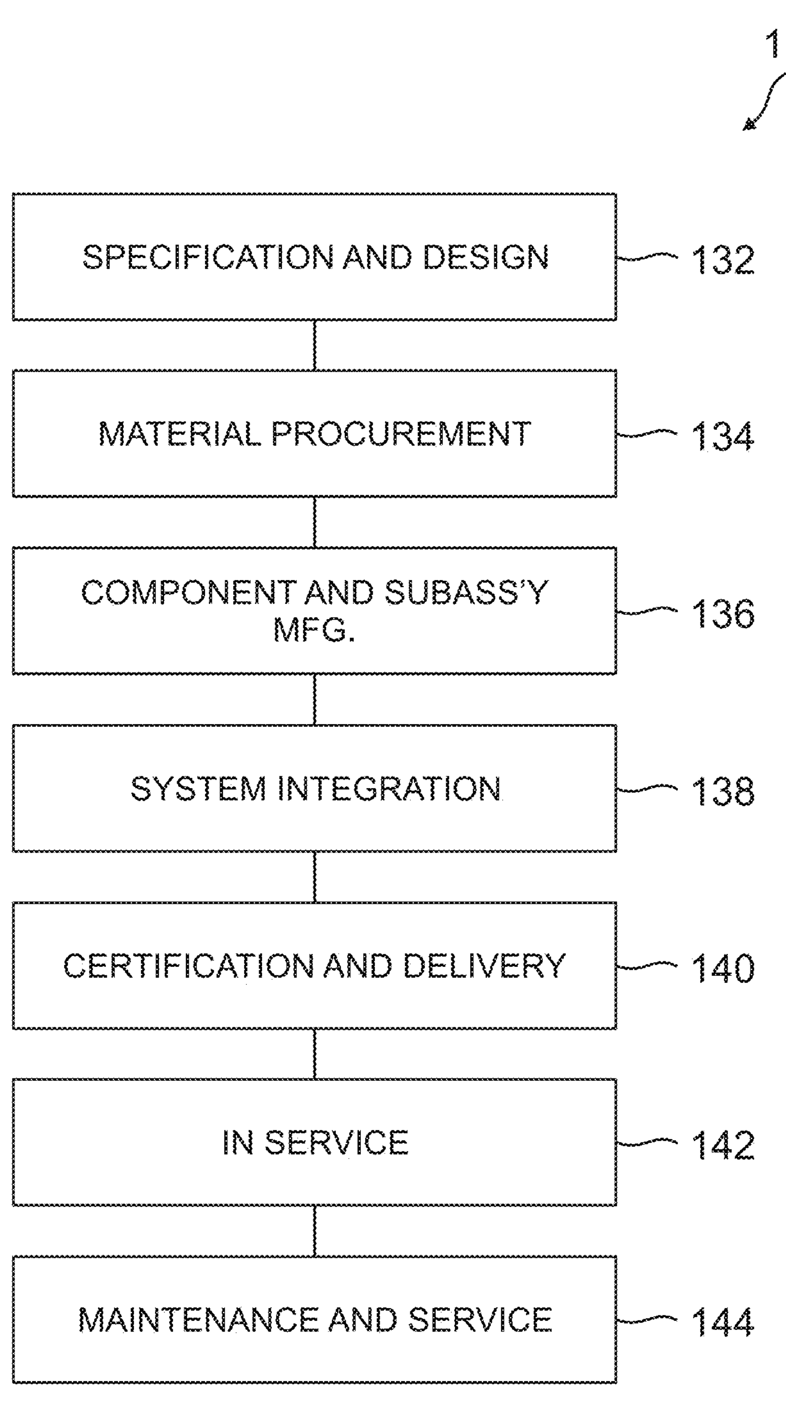

FIG. 14 illustrates an example of a method of fabricating a solar cell array for a satellite.

Figure 15:
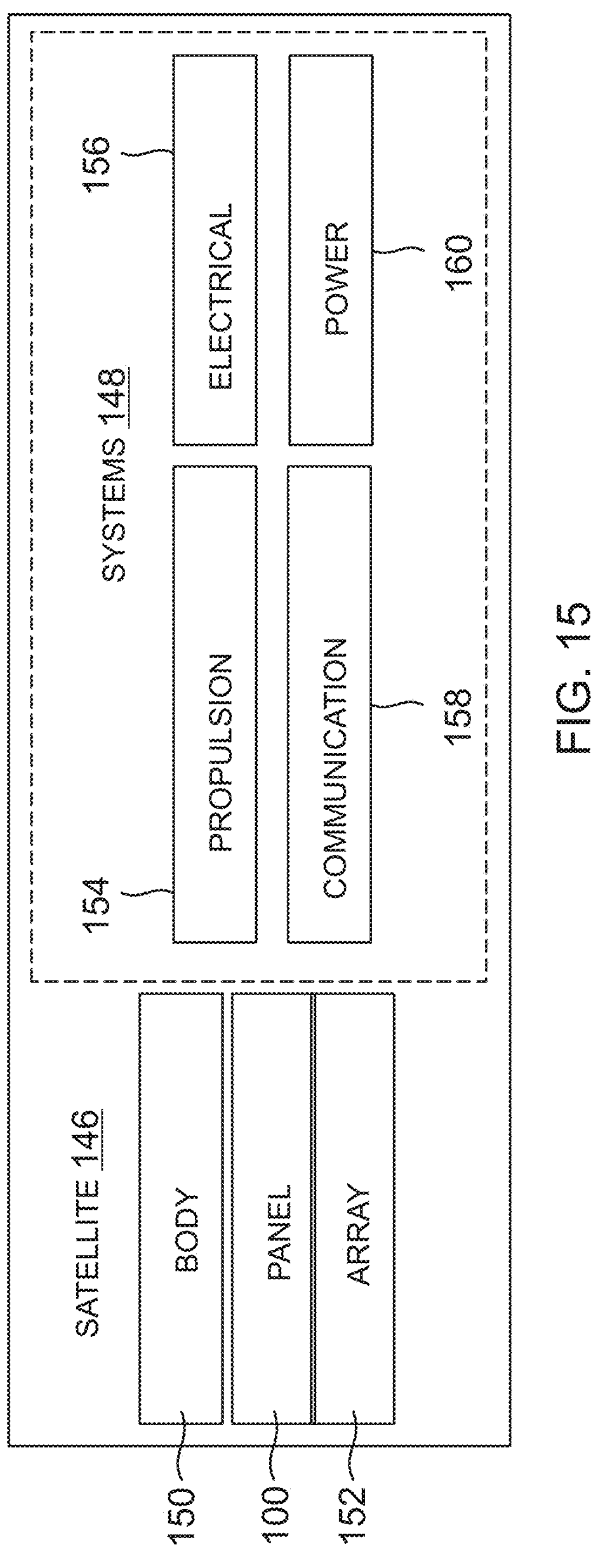

FIG. 15 illustrates an example of a satellite including a solar cell array.

Figure 16:
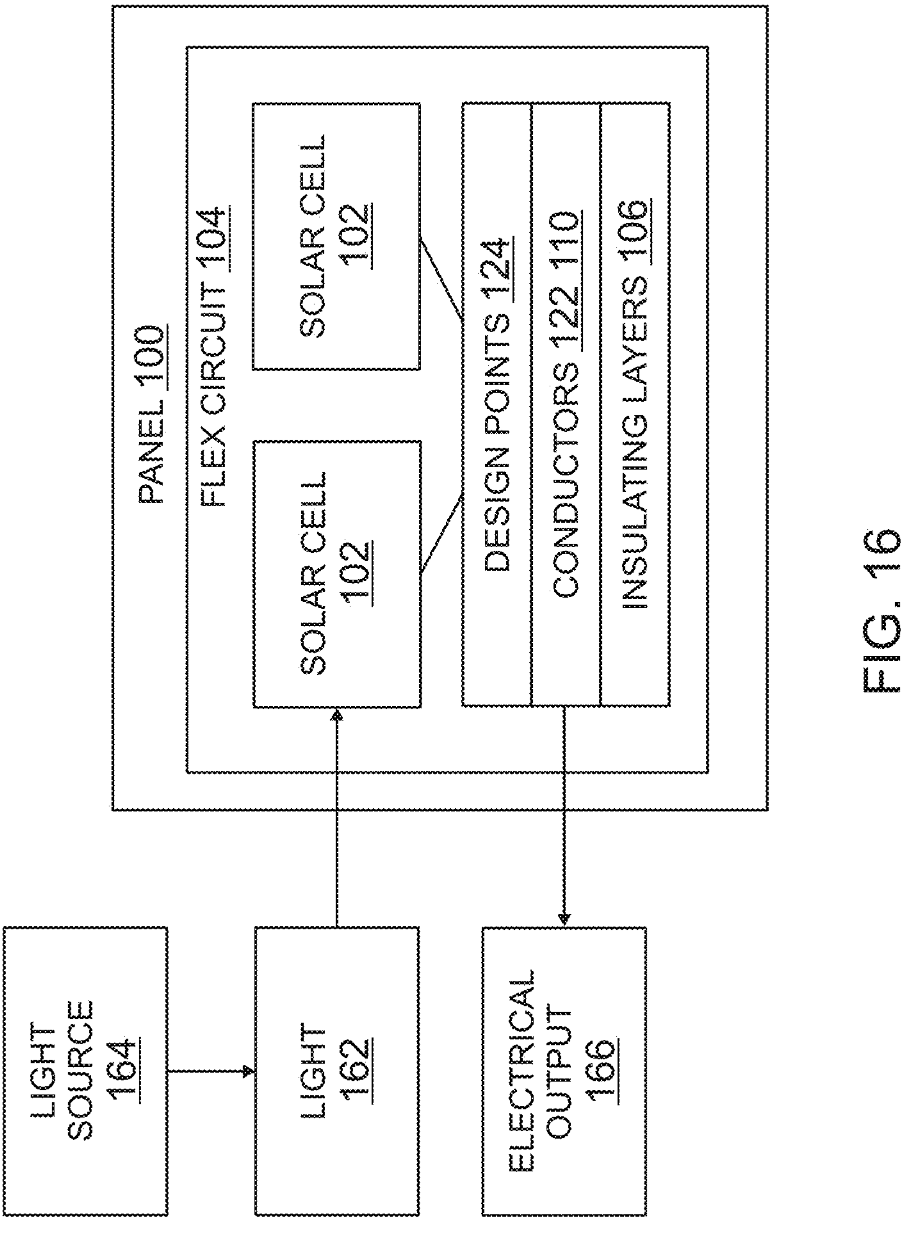

FIG. 16 illustrates an example of a solar cell array in the form of a functional block diagram.

DETAILED DESCRIPTION

In the following description, reference is made to the accompanying drawings which form a part hereof, and in which is shown by way of illustration a specific example in which the disclosure may be practiced. It is to be understood that other examples may be utilized, and structural changes may be made without departing from the scope of the present disclosure.

General Description

There is a need for a generic solar cell array that can be rapidly tailored to achieve a variety of output voltages, in order to provide rapid delivery for a diverse set of missions. For example, priority missions often desire deliveries in weeks, but current approaches may require months due to extensive design, manufacturing, and testing of solar cell arrays.

This disclosure describes a generic spaceflight-capable solar cell array that can be rapidly tailored to achieve a variety of output voltages. Solar cell arrays for satellites vary with each mission and prior attempts to standardize solar cell arrays have led to loss of power undermining cost or schedule advantages sought to be achieved.

This disclosure describes a new layout and improved process for a substrate comprising a pre-fabricated flex circuit used in a solar power module (SPM) that can be customized to a desired dimension of the solar cells and output voltage for a mission and delivered quickly. Specifically, this disclosure makes intelligent decisions about what a final layout might look like and removes extraneous traces. Known switching techniques may be used as well.

One aspect of this disclosure is forming an efficient layout for electrical conductors and traces. The conducting pathways are set, unused pathways are removed, and flexibility may be achieved with switches, if necessary. Specifically, this disclosure starts with a generic set of pathways once and removes any extra (i.e., unneeded) pathways.

Selecting Current Pathways

U.S. Utility application Ser. No. 15/643,277, filed on Jul. 6, 2017, by Eric Rehder, entitled "PREFABRICATED CONDUCTORS ON A SUBSTRATE TO FACILITATE CORNER CONNECTIONS FOR A SOLAR CELL ARRAY," which is set forth above in the section entitled "CROSS REFERENCE TO RELATED APPLICATIONS" and incorporated by reference herein, describes how to select current pathways for solar cells by adding conductive elements to a corner region to bridge between conductive paths, or by removing conductive elements from the corner region to isolate between conductive paths.

The use of electrical connections between solar cells in the corner regions not only facilitates manufacturing, it also supports customization. The use of prefabricated conductors result in traces and conductors positioned throughout a circuit to enable flexibility in design. The electrical connections may be customized for every circuit length to aid in the panel manufacturing, to direct current or power to a next solar cell in a circuit or to terminate the string. However, this also results in extraneous traces and conductors.

There remains a need to remove or add conductive elements, determine how many conductive elements to remove or add, and determine from what locations the conductive elements should be removed or added, in order to achieve a desired design or output voltage. This disclosure meets those needs.

Moreover, removal and addition techniques, including techniques such as, e.g., cutting, laser ablation, deposition, welding, etc., are known for removing and/or adding metals.

However, prior use of such techniques led to complexity to achieve a desired power output level. This disclosure reduces that complexity.

Pre-Fabricated Flex Circuits With Custom Voltage

This disclosure improves manufacturing time by reducing the amount of work involved in breaking or forming conductive paths. The new layout and improved process allows a generic solar cell array to be built and quickly tailored to achieve a variety of output voltages.

Figure 1A:
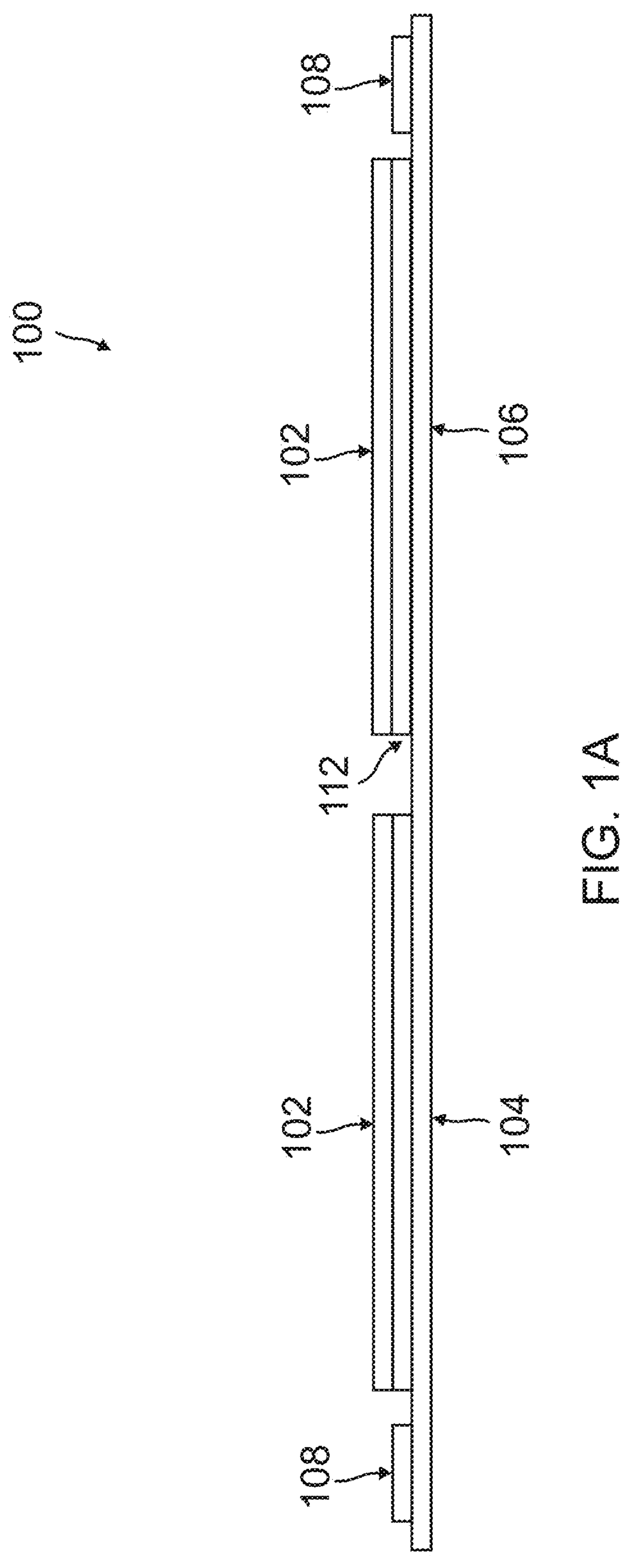
FIGS. 1A, 1B and 1C are cross-sectional side views that illustrate examples showing solar cells attached to a substrate.
Figure 1B:
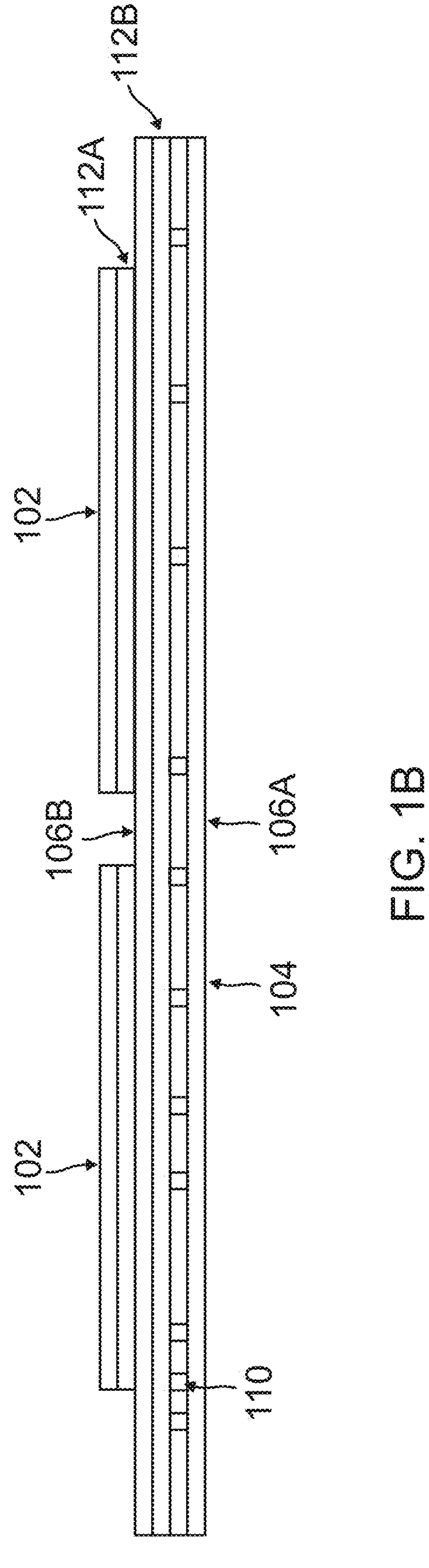
Figure 1C:
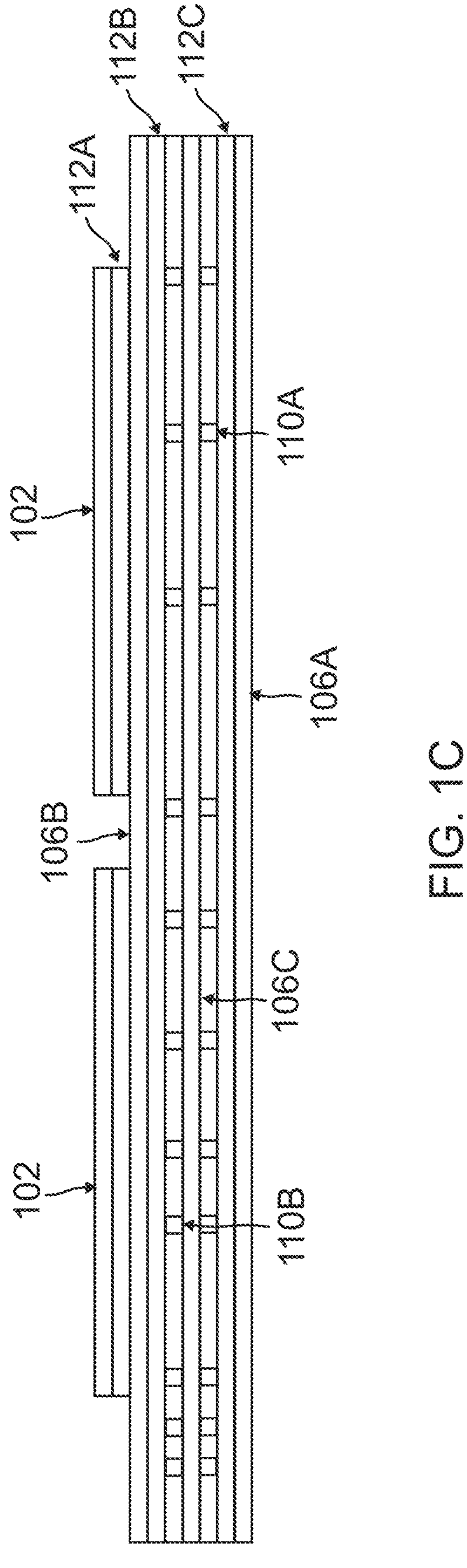

FIGS. 1A, 1B and 1C are cross-sectional side views that illustrate examples showing a solar cell panel 100 including a circuit of solar cells 102 attached to a substrate 104, such as a pre-fabricated flex circuit, as well as the layers and components of the substrate 104.

FIG. 1A illustrates an example showing two solar cells 102 attached to a substrate 104, wherein the substrate 104 is comprised of one or more insulating layers 106, comprised of Kapton®, polyimide or other insulating material, and a plurality of conductors 108, comprised of at least one patterned conductive metal layer such as a Copper (Cu) layer, deposited on top of the insulating layer 106. The solar cells 102 are attached to the insulating layer 106 using an adhesive 112.

FIG. 1B illustrates an example showing two solar cells 102 attached to a substrate 104, wherein the substrate 104 is comprised of a plurality of insulating layers 106A, 106B. At least one electrical conductor 110, comprised of one or more patterned conductive metal layers such as a Copper layer, is deposited on top of the insulating layer 106A. Insulating layer 106B is attached on top of the electrical conductor 110, and on or above the insulating layer 106A, using an adhesive 112B. The electrical conductors 110 are embedded within the substrate 104 for making series connections between the solar cells 102. The solar cells 102 are attached to the insulating layer 106B using an adhesive 112A.

FIG. 1C illustrates an example showing two solar cells 102 attached to a substrate 104, wherein the substrate 104 is comprised of a plurality of insulating layers 106A, 106B, 106C. At least one electrical conductor 110A, comprised of one or more patterned conductive metal layers such as a Copper layer, is deposited on the bottom of insulating layer 106C, and at least one electrical conductor 110B, comprised of one or more patterned conductive metal layers such as a Copper layer, is deposited on the top of insulating layer 106C. Insulating layer 106A is attached to the bottom of the conductor 110A, and on or below the insulating layer 106C, using an adhesive 112C, and insulating layer 106B is attached to the top of the conductor 110B, and on or above the insulating layer 106C, using an adhesive 112B. The solar cells 102 are attached to the insulating layer 106B using an adhesive 112A.

FIGS. 2, 3A, 3B, 4A, 4B, 4C, 4D, 4E, 4F, 4G, 5, 6, 7, 8, 9, 10, 11, 12 and 13 are top views that show the solar cells 102 and substrate 104 as being transparent for the purposes of illustrating the placement and functions of the conductors 110. As noted above in FIGS. 1A, 1B and 1C, the conductors 110 are actually embedded within the substrate 104, preferably encapsulated by the insulating layers 106, extending underneath the solar cells 102, and electrically interconnect the groups of solar cells 102.

Figure 2:
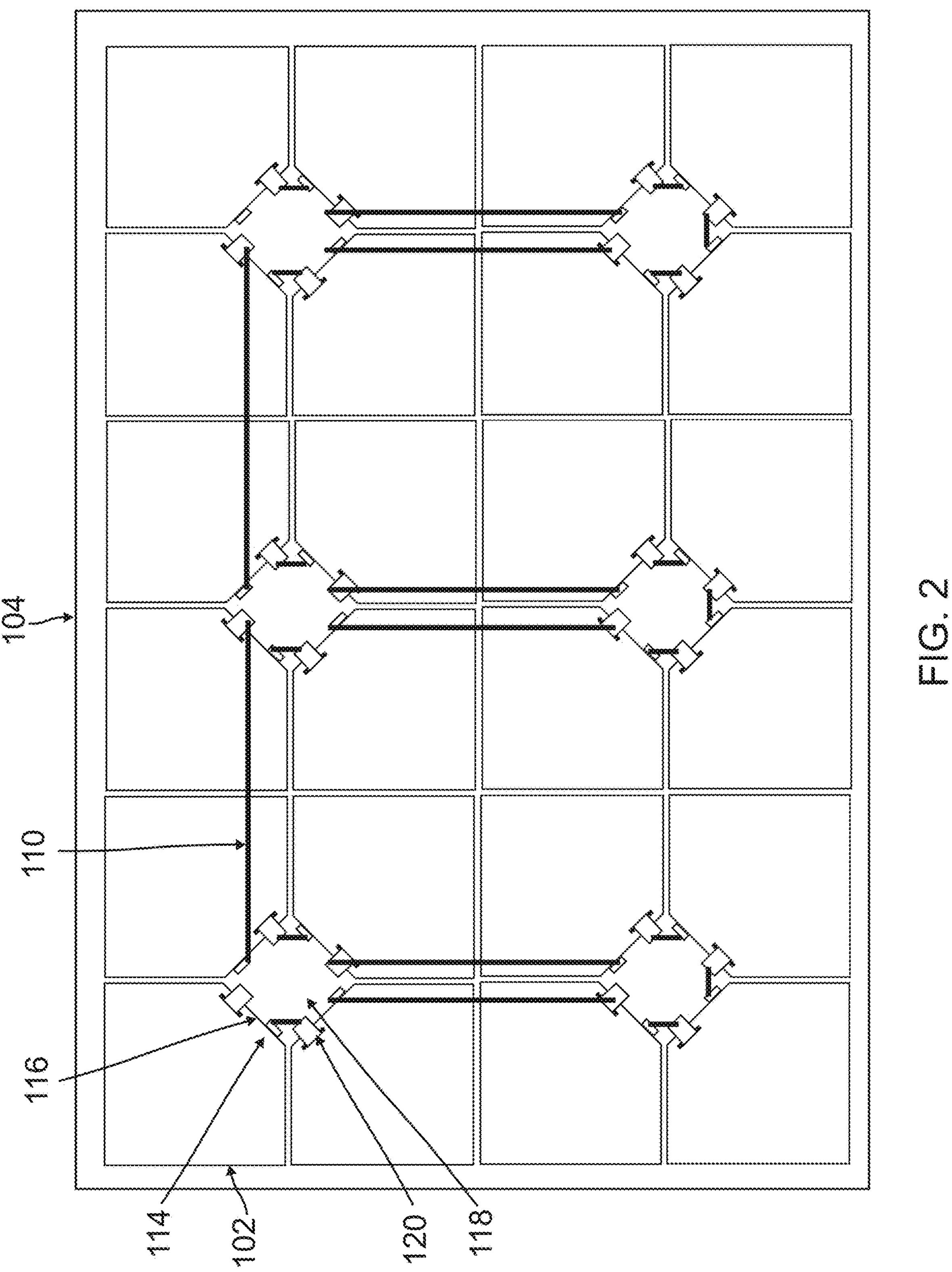
FIG. 2 illustrates an example showing an array of solar cells attached to a substrate.

FIG. 2 illustrates an example showing an array of solar cells 102 attached to a substrate 104, wherein the array of solar cells 102 comprises 24 solar cells 102 arranged in 4 rows and 6 columns, generating an output voltage of 48V (i.e., approximately 2V per solar cell 102 at operating temperature and end-of-life (EOL) radiation damage).

In this example, each solar cell 102 has at least one cropped corner 114 that defines a corner region 116. Groups of four adjacent solar cells 102 are aligned and attached to the substrate 104, such that four cropped corners 114, one from each solar cell 102, are brought together at the corner regions 116. The substrate 104 is configured such that an area 118 of the substrate 104 remains exposed when corner regions 116 of adjacent ones of the solar cells 102 are aligned and the solar cells 102 are attached to the substrate 104. The area 118 of the substrate 104 that remains exposed includes one or more of the conductors 110, and one or more electrical connections between the solar cells 102 and the conductors 110 are made in the exposed area 118.

The electrical connections between the solar cells 102 and the conductors 110 are made using, in one example, metal foil interconnects 120 with each solar cell 102 having at least one interconnect 120 attached to the n-type side of the solar cell 102 and at least one interconnect 120 attached to the p-type side of the solar cell 102. Although the conductors 110 are shown in this top view for the purposes of illustration, as noted above in FIGS. 1A, 1B and 1C, the conductors 110 are embedded within the substrate 104, preferably encapsulated by the insulating layers 106, extending underneath the solar cells 102, and electrically interconnect the groups of solar cells 102. In the example of FIG. 2, the conductors 110 and the interconnects 120 connect all of the solar cells 102, and the conductors 110 and the interconnects 120 connect all of the solar cells 102, both horizontally and vertically.

In one example, the ends of the conductors 110 are aligned and exposed through a surface of the substrate 104 in the area 118 of the substrate 104 that remains exposed, in order to electrically connect to the interconnects 120. The conductors 110 may also be electrically connected to the interconnects 120 using vias in the substrate 104. In addition, the conductors 110 may be attached to, printed on, or deposited on a surface of the substrate 104, before and/or after the solar cells 102 are attached to the substrate 104, which also facilitates connections between the solar cells 102.

Figure 3A:
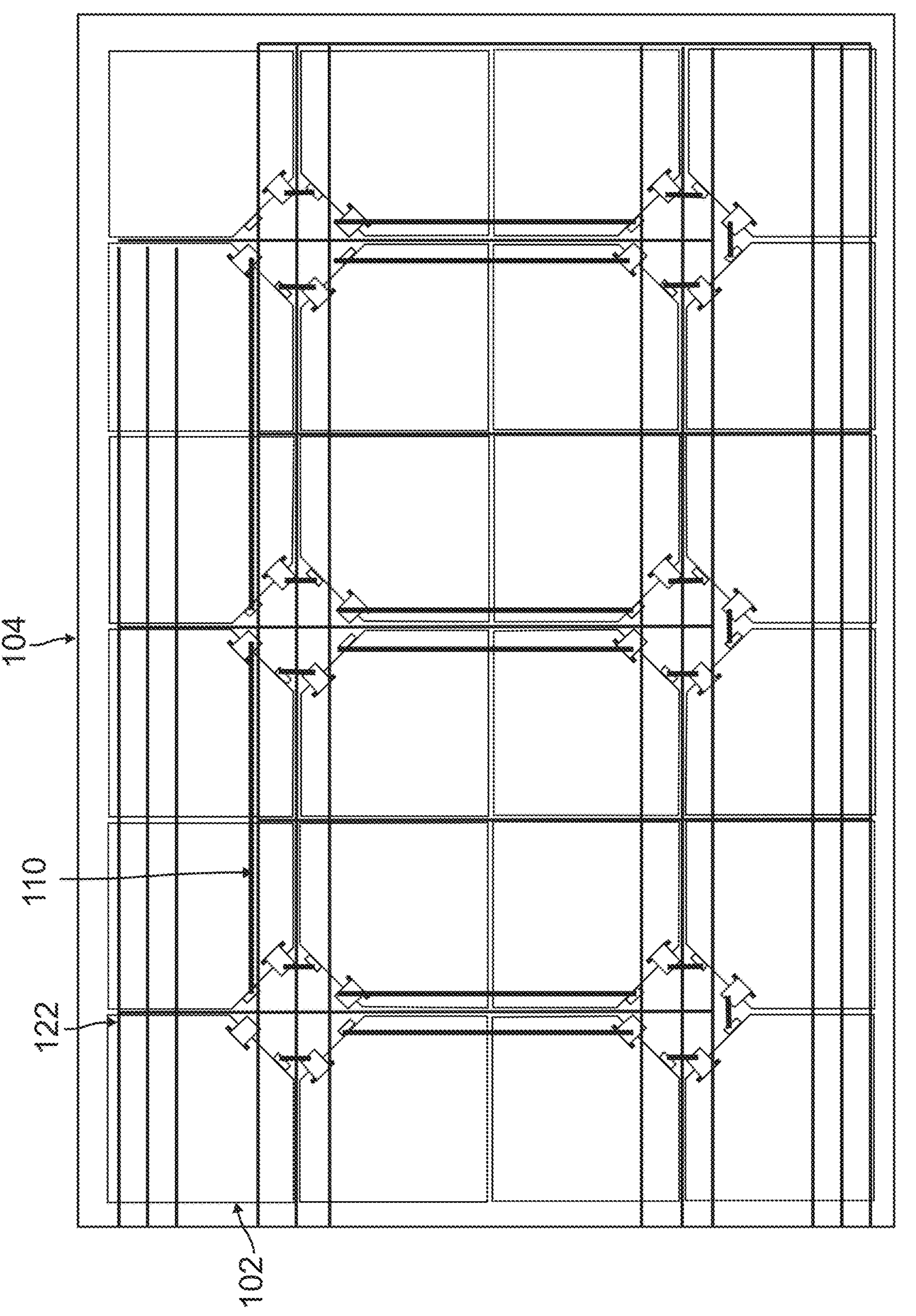
FIGS. 3A, 3B and 3C illustrate another example of a substrate, which is a variant of FIG. 2.

FIG. 3A illustrates another example of a substrate 104, namely, a variant of FIG. 2, that adds one or more electrical conductors 122 that are circuit termination lines for the solar cells 102, which, like conductors 110, are also embedded in the substrate 104. As noted above, the figures show the solar cells 102 and substrate 104 as being transparent, in this instance for the purposes of illustrating the placement and functions of both the conductors 110, 122. At least some of the conductors 122 are connected together at their crossing points. In the corner regions 114, the conductors 122 cross the conductors 110, where the conductors 122 and the conductors 110 are connected.

At least some of the conductors 110, 122 may be patterned in separate conductive metal layers in the substrate 104, wherein the conductors 110, 122 on the multiple conductive metal layers of the substrate 104 are connected using vias and the like in the substrate 104.

Moreover, at least some of the conductors 110, 122 may be formed together in one conductive metal layer in the substrate 104. A strength of this layout is that it can be achieved with a single metal layer, which is preferred. The single metal layer is cheaper to produce, is lighter, and more flexible.

Figure 3B:
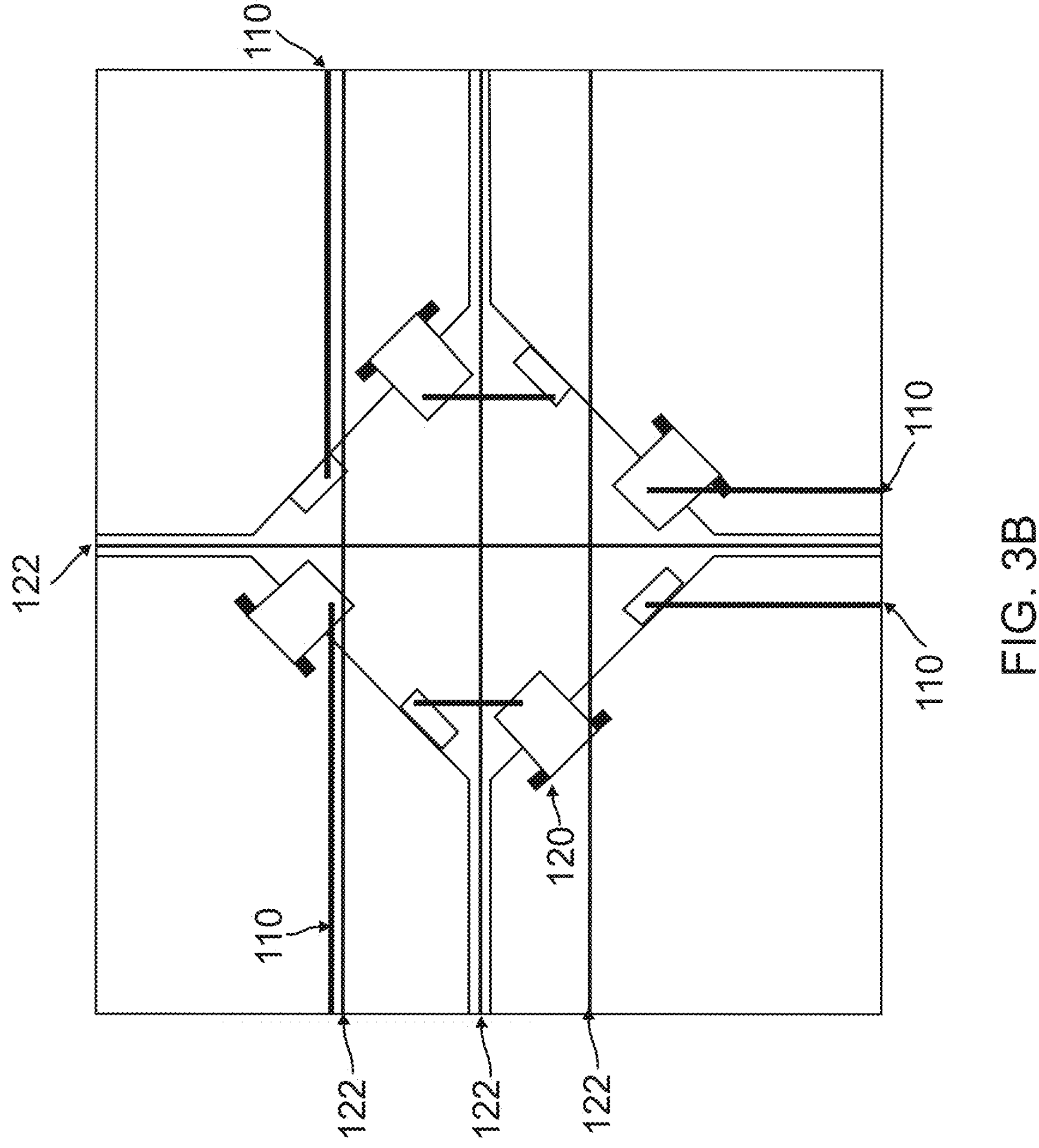

FIG. 3B provides further detail of the connections made in a corner region of the solar cells 102. Metal foil interconnects 120 are connected to the n-type or p-type side of the solar cell 102. The metal foil interconnects 120 are connected to a conductor 110, which is embedded in the substrate 104, covered by an insulating layer 106, and extends under the solar cells 102. There are openings in the insulating layer 106, not pictured, that allow the metal foil interconnects 120 to be connected to the conductors 110.

The conductors 122 also are embedded in the substrate 104, covered by an insulating layer 106, and extend under the solar cells 102. The conductors 122 may form electrical connections, for example, where the conductors 122 cross, touch or are adjacent to other conductors 110 or 122. In one example, the conductors 110, 122 are patterned in one or more metal layers of the substrate 104, and the electrical connections between the conductors 110, 122 comprise a contiguous metal layer. Nonetheless, the conductors 110, 122 have different functions and purposes from each other.

Figure 3C:
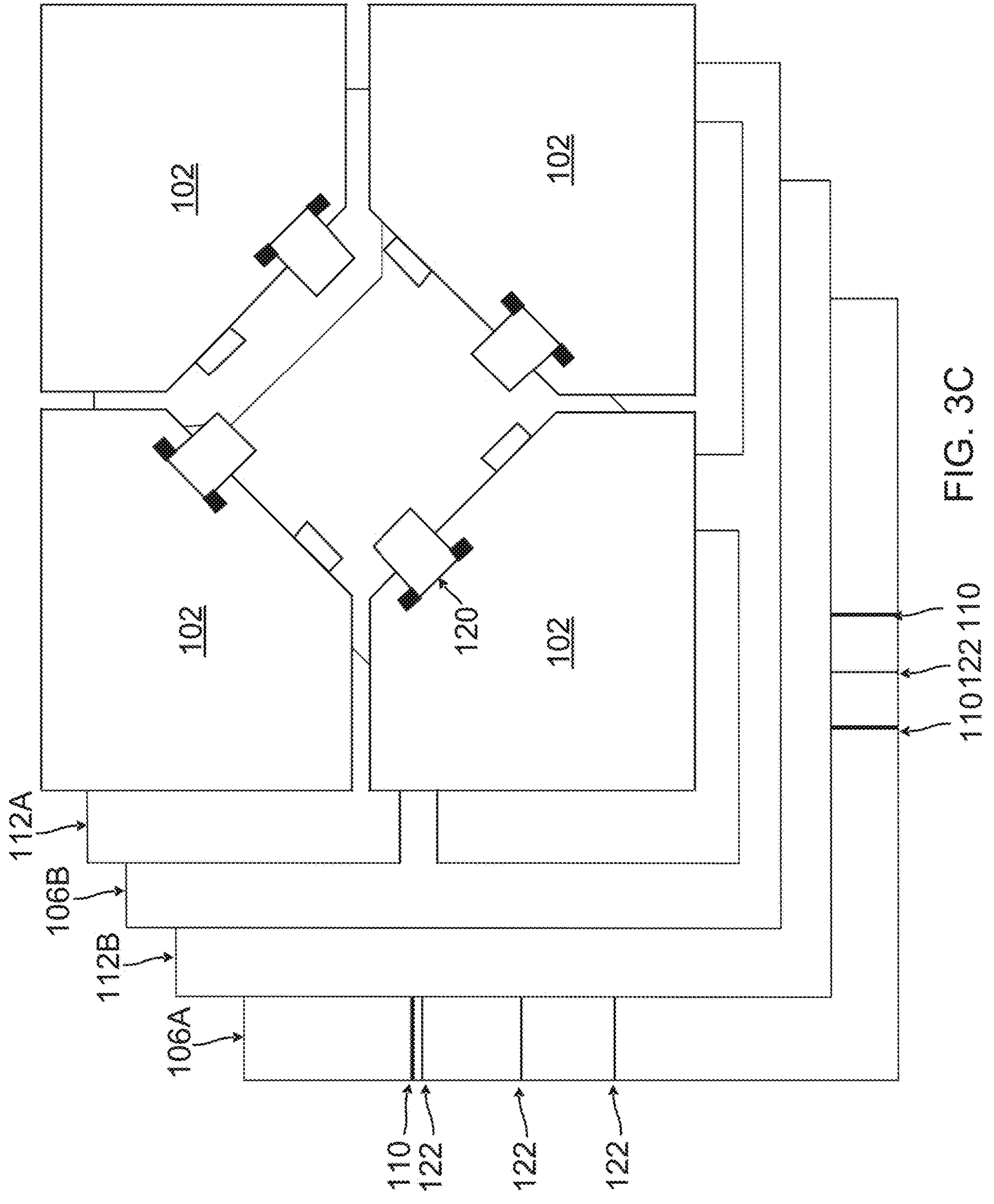

FIG. 3C is an exploded view of FIG. 3B further illustrating the conductors 110, 122. In this view, the solar cells 102 are attached to the insulating layer 106B using the adhesive 112A. The electrical conductors 110, 122 are formed on top of the insulating layer 106A. Insulating layer 106B is attached on top of the electrical conductors 110, 122, and on or above the insulating layer 106A, using the adhesive 112B. Thus, like electrical conductors 110, the electrical conductors 122 are embedded between the insulating layers 106A, 106B. In other examples, however, the electrical conductors 110, 122 may be formed on and embedded between different insulating layers.

Figure 4A:
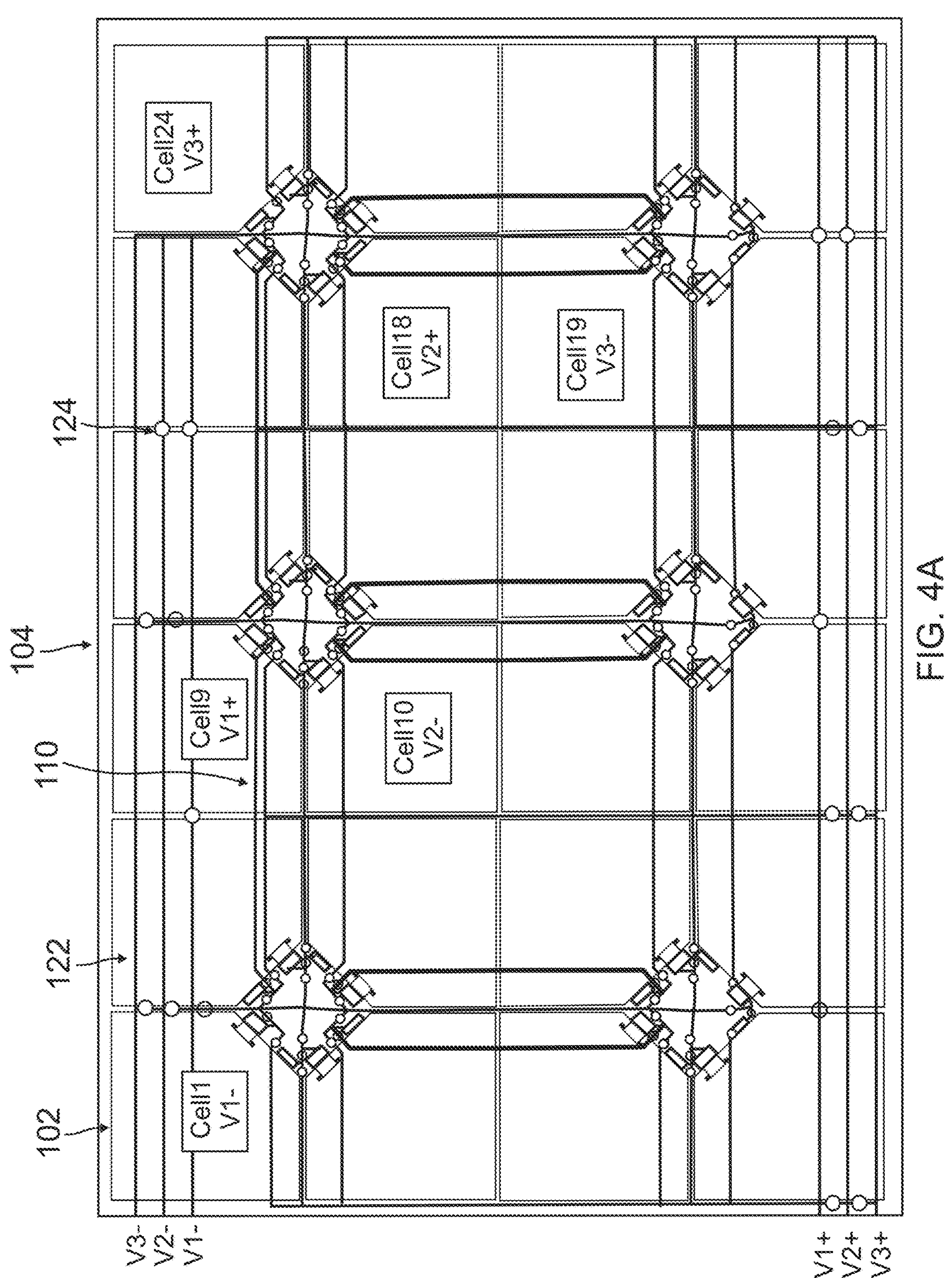
FIGS. 4A, 4B, 4C, 4D, 4E, 4F and 4G illustrate another example of a substrate, which is a variant of FIG. 3.

FIG. 4A illustrates another example of a substrate 104, namely, a variant of FIG. 3A, that provides for removing or adding electrical continuity to the conductors 110, 122 using decision points 124 located at many critical points across the substrate 104 to define a series configuration of the solar cells 102, a parallel configuration of the solar cells 102, or both a parallel and series configuration of the solar cells 102. These decision points 124 are locations where a decision may be made to make or break the electrical continuity of the conductors 110 and/or the conductors 122, thereby assigning each of the solar cells 102 to the conductors 110, 122 as a series connection or a circuit termination, in order to minimize a number of the conductors 110, 122. Thus, at least some of the conductors 110 are series connections for the solar cells 102, and at least some of the conductors 122 are circuit terminations for the solar cells 102.

In this figure, the decision points 124 are represented by circles, which are not actually present on the substrate 104, but are merely used for clarifying and explaining the solution. The circles of the decision points 124 may be solid or hollow, wherein a solid white circle represents a decision point 124 where electrical continuity is broken or does not exist for the conductor 110, 122, while a hollow circle (with the conductors 110, 122 showing through) represents a decision point 124 where electrical continuity is made or unbroken for the conductor 110, 122. Electrical continuity may be broken at the decision points 124, e.g., by cutting a trace, removing an interconnect, triggering a fuse, etc. Alternatively, electrical continuity may be maintained or made at the decision points 124, e.g., by adding a jumper, adding an interconnect, triggering an anti-fuse, etc.

In this example, using the decision points 124, the conductors 122 are configured into three sets of termination lines, labeled as V1+ and V1−, V2+ and V2−, and V3+ and V3−, respectively, wherein V1, V2, and V3 are each different circuits. The solar cells 102 begin with series connections to form circuit V1, followed by circuits V2 and V3. In the corner region 116 of each solar cell 102, the conductors 110, 122 110 are made or broken to reassign each cell-to-cell connection as a series connection or as a circuit termination to a V+/− pair. The layout of this example has the conductors 122 broken to form three (3) circuits V1, V2, and V3, with nine (9) solar cells 102 in circuit V1 and V2, while circuit V3 has six (6) solar cells.

For the purposes of illustration, numbering of the solar cells 102 begins from the top left solar cell 102 (Cell1) in the first column, down the rows of the first column, from the bottom of the second column, up the rows of the second column, from the top solar cell 102 (Cell9) in the third column, down the rows of the third column (Cell10 and the solar cells 102 in the third column below Cell10), and continues in a serpentine pattern through the fourth and fifth columns (Cell18 and Cell19) to the top right solar cell 102 (Cell24) in the sixth column.

The corner region 116 for Cell1 has a hollow circle that represents a decision point 124 with an unbroken conductor 122. This shows how Cell1 is connected to V1− and series-connected to Cell2. Solid circles that represent a decision point 124 with a broken conductor 122 also show V1− disconnected from the traces in the V2− and V3− circuits. Bypass diodes (not shown) may be located in the corner region 116 to protect the solar cells 102 from reverse biasing.

In this example, the positive contact of Cell9 connects to V1+; Cell10 connects to V2−; Cell18 connects to V2+; Cell19 connects to V3−; and Cell24 connects to V3+. The V3 circuit has fewer solar cells 102 and would have a lower voltage than the V1 and V2 circuits. Voltage could be added to the V3 circuit with another circuit on another panel (not shown). Alternatively, the panel 100 could be increased in size.

Figure 4B:
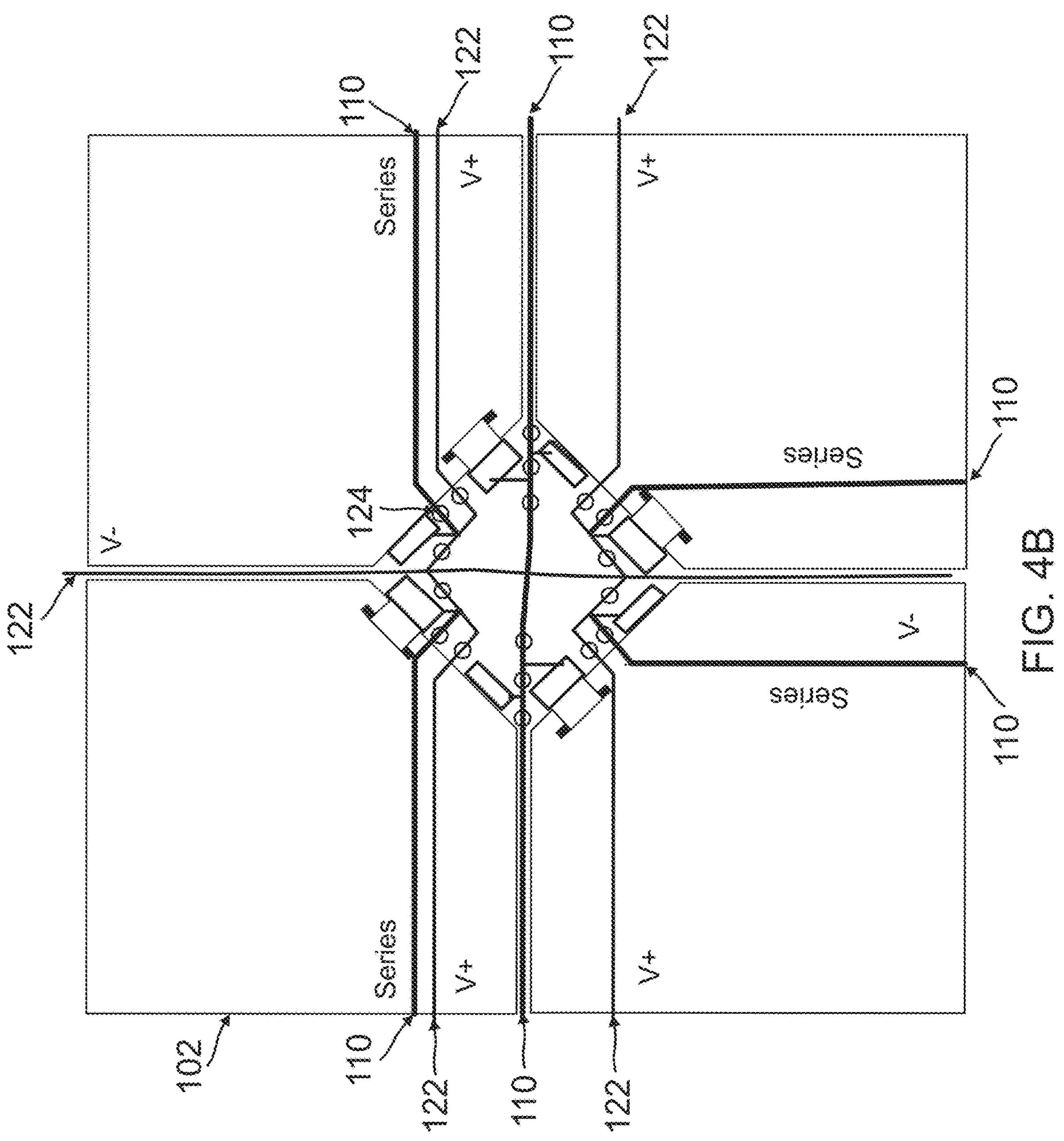
Figure 4C:
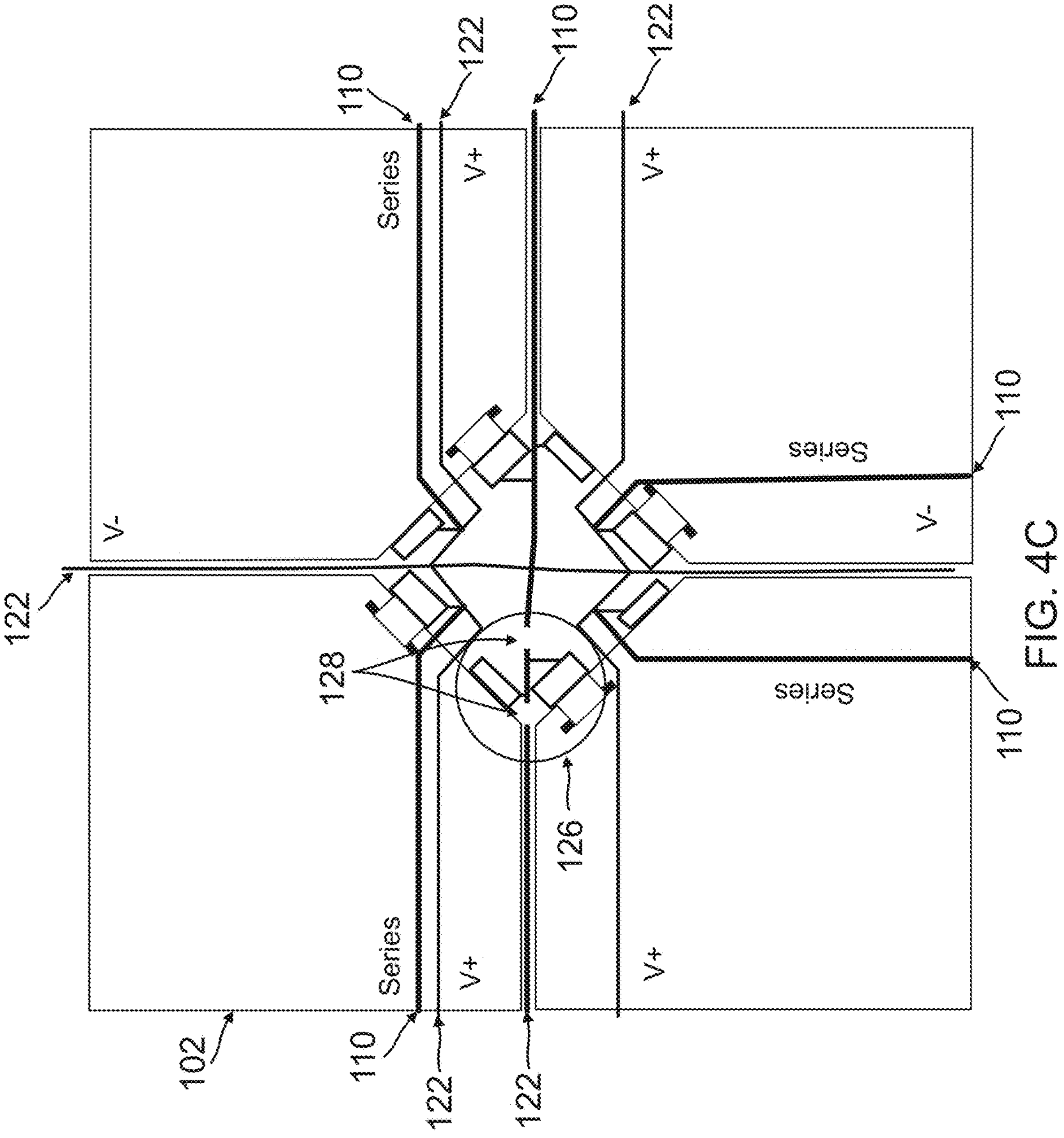
Figure 4D:
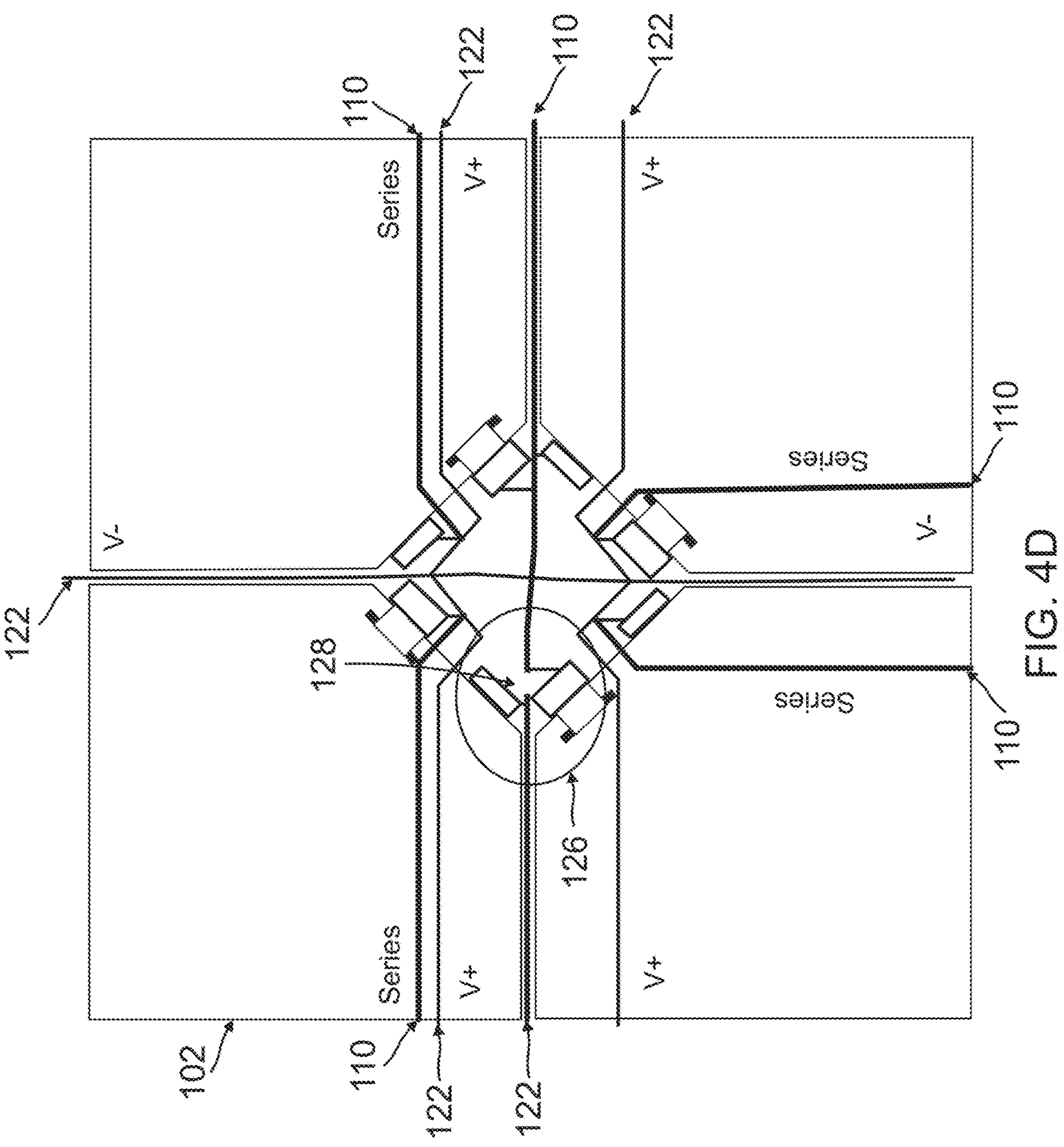

Further detail of the traces in a corner region 116 between row 1 and 2 is provided in FIGS. 4B, 4C and 4D.

FIG. 4B shows the traces for the various conductors 110, 122 and has circles indicating the decision points 124. Thus, each conductor 110, 122 from each solar cell 102 can have a series or a circuit termination V+, V−, and each can be independently open or closed.

FIG. 4C examines the results of the decision points 124. In this figure, the results are shown within the circle 126, which is not actually present on the substrate 104, but is merely used for clarifying and explaining the solution. Only the decision points 124 in circle 126 are examined. In FIG. 4C, the connections for series connection between cell are demonstrated. Within the circle 126, there are two gaps or discontinuities 128 in the horizontal conductor 122. These discontinuities 128 are the result of the decision points 124 being used to break the current flow to the V+ and V− conductors 122. The other conductors 110, 122 remain intact.

FIG. 4D shows the configuration of the decision point 124 within circle 126 in order to terminate the circuits between these solar cells 102. Within the circle 126, there is a single gap or discontinuity 128, which indicates that the conductor 122 is broken at this point. In this alternate scenario, the series connection between the solar cells 102 is broken, and the top left solar cell 102 terminates to the V+ output and the bottom left solar cell 102 terminates to the V− output.

Figure 4E:
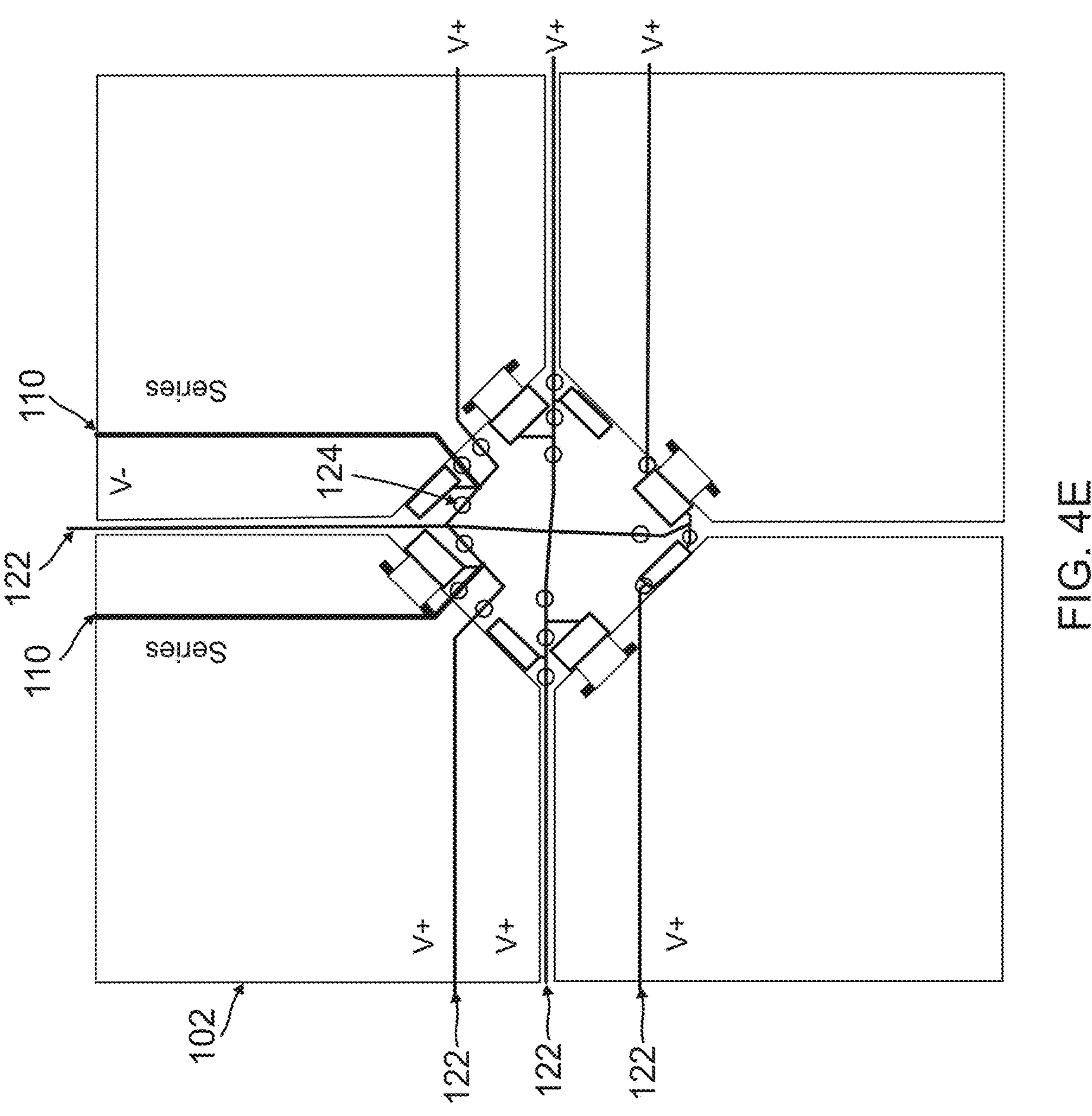

FIG. 4E shows the conductors 110, 122 between row 3 and 4 with the decision points 124. The conductors 122 from each solar cell 102 is a circuit termination V+, V−.

Figure 4F:
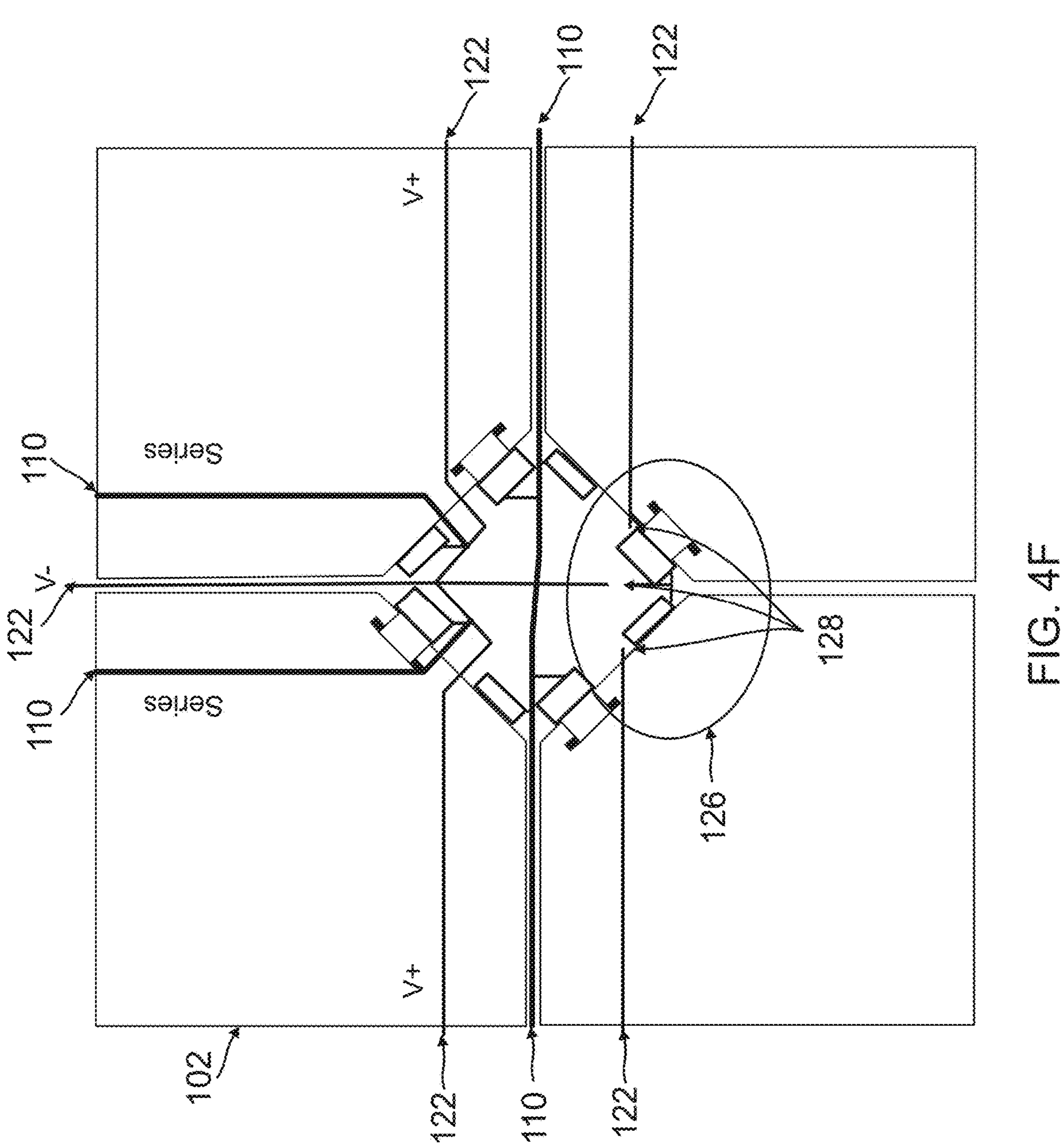

In FIG. 4F, the connections are made to maintain a series connection for the solar cells 102. The series connection uses conductor 110 between the bottom left and right solar cells 102. Within the circle 126, there are discontinuities 128 made in the conductors 122 connecting to the V+ and V− outputs.

Figure 4G:
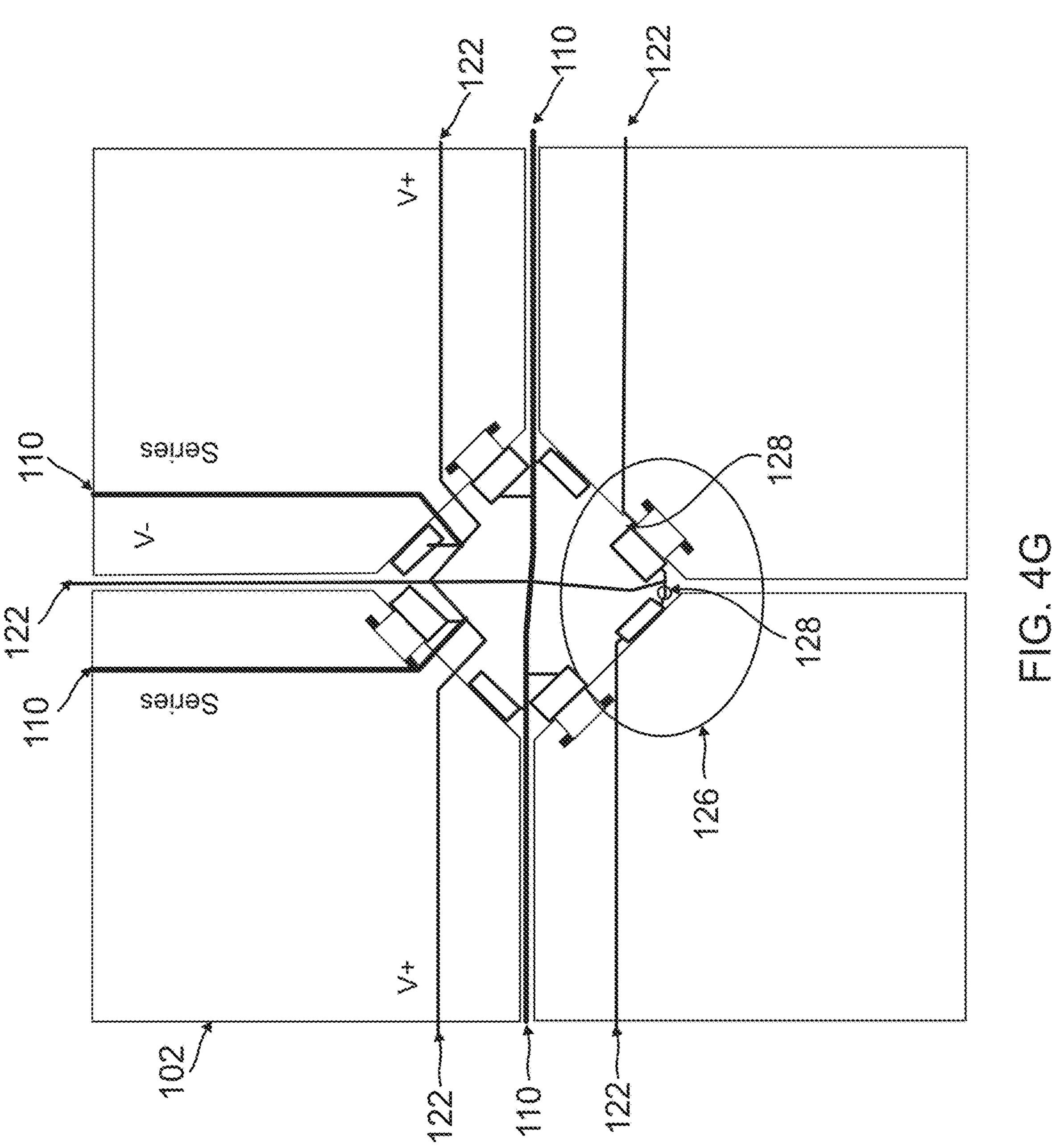

In FIG. 4G, the connections are made to maintain circuit terminations to V+ and V− for the solar cells 102. Within the circle 126, the series connections of conductor 122 has a discontinuity 128. The bottom left solar cell 102 is connected to the V+ output, and the bottom right solar cell 102 is connected to the V− output. The bottom right solar cell 102 also has the opportunity to connect to a V+ output, but this path has a discontinuity 128 as well.

It is noted that these examples have a large number of conductors 110, 122 and decision points 124 where the conductors 110, 122 may be broken. This disclosure describes new ways to modify this configuration. Specifically, concepts described in FIG. 4A have complete control over the connections to the array of solar cells 102. In reality, this level of control is not necessary and leads to overly complicated solutions with more conductors 110, 122 and decision points 124 to make or break.

Figure 5:
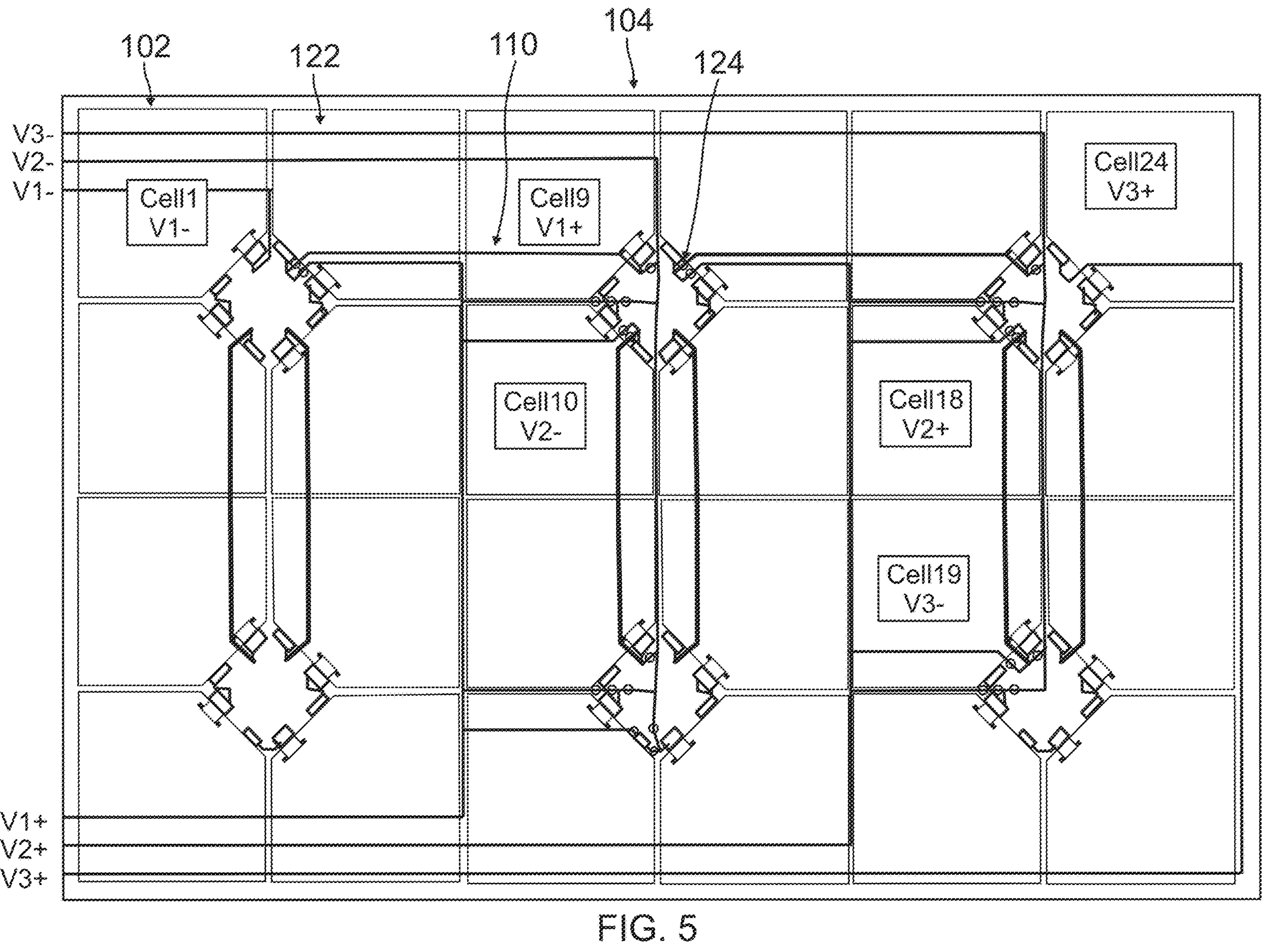
FIG. 5 illustrates another example of the substrate, which is a variant of FIG. 4A.

FIG. 5 illustrates another example of the substrate 104, namely, a variant of FIG. 4A, that simplifies the layout of conductors 110, 122 to more fully optimize the configuration to a desired dimension of the solar cells and/or a desired output voltage, while serving a broad array of applications. This example is for a variety of applications where circuit lengths can be adjusted from 8 to 17 solar cells 102, which generate an output voltage ranging from approximately 16V to 34V, although other ranges may be used as well. Knowledge of the application of the array of solar cells 102 may inform the builder that outputs of less than 16V are unlikely and more than 34V are unlikely.

Thus, the design can be simplified to meet the variability of anticipated needs. The desired output voltage and adjustment range in an application will be determined. This allows great simplification from the baseline of FIGS. 4A, 4B, 4C, 4D, 4E, 4F and 4G, which provide for full configuration control.

This is often not necessary and simpler designs like FIG. 5 can be preferred, which eliminate a large number of conductors 110, 122 and decision points 124. The connections are identified with solid and hollow circles at the decision points 124 to form the two circuits V1 and V2, each with 12 solar cells 102. The result is that, rather than an array of 24 solar cells 102 having 100 decision points 124 between the solar cells 102, this improved version has only 27 decision points 124 between the solar cells 102. The number of conductors 122 providing circuit terminations also decreases substantially.

Figure 6:
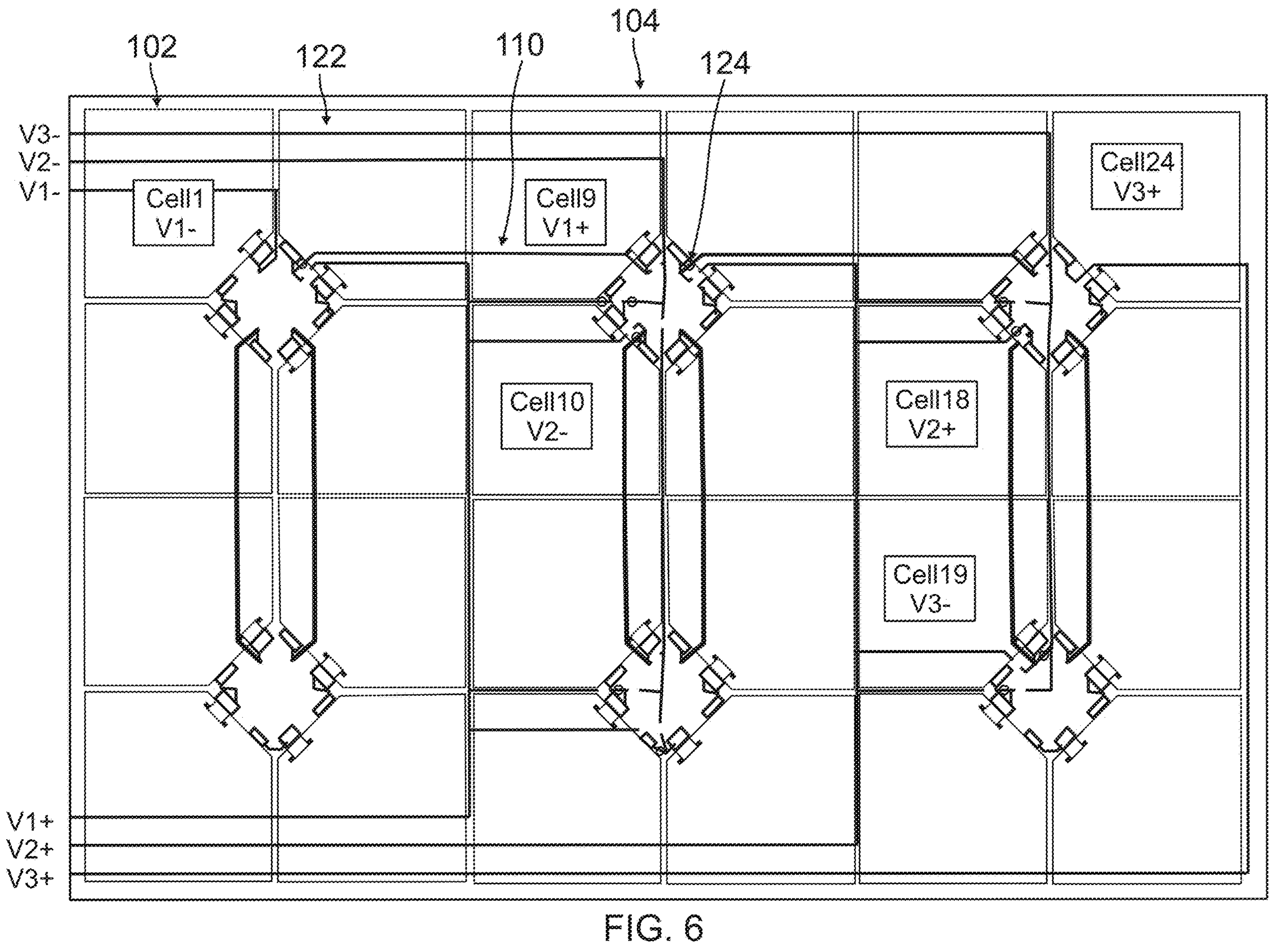
FIG. 6 illustrates another example of the substrate, which is a variant of FIG. 5.
Figure 7:
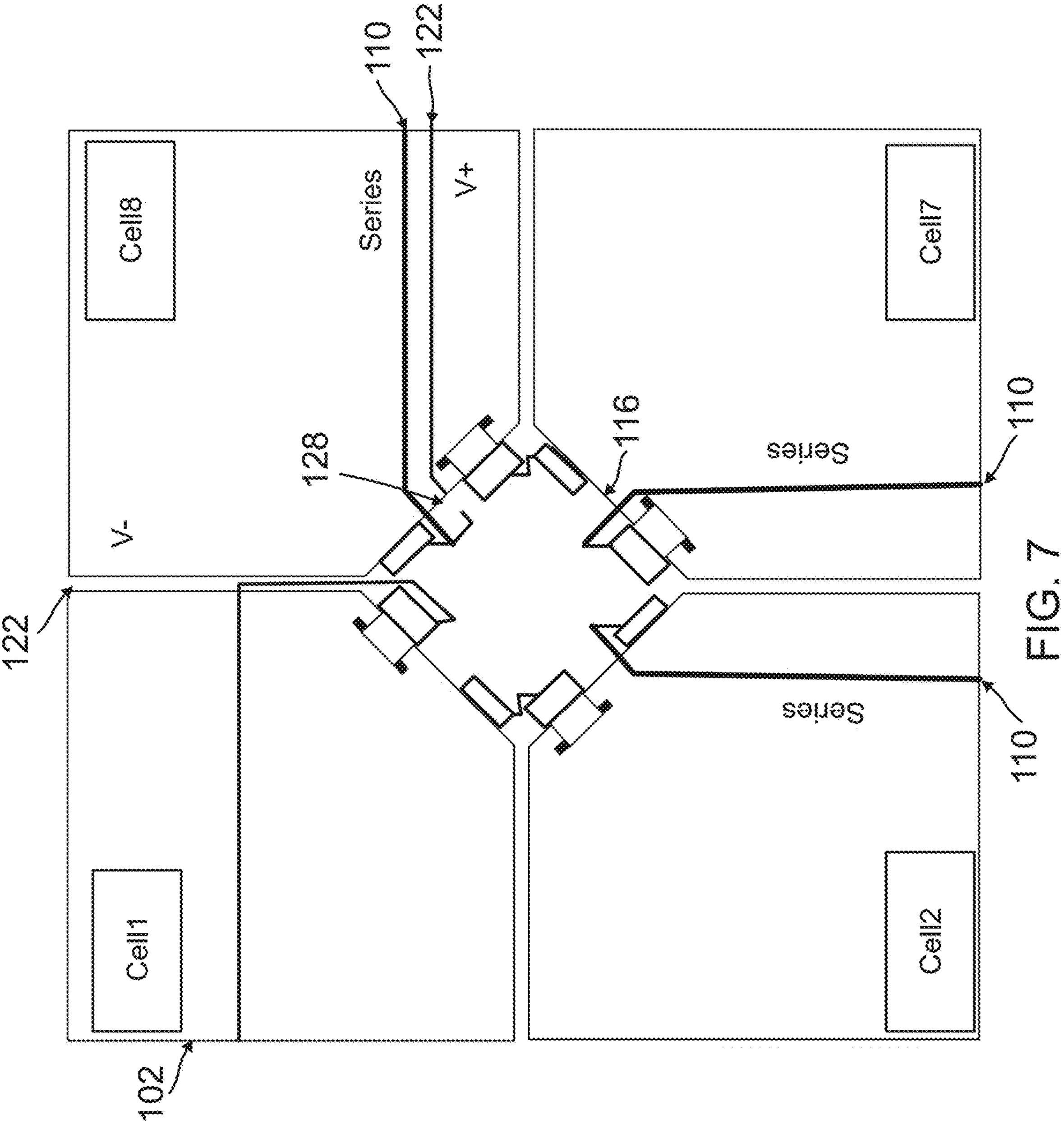
Figure 8:
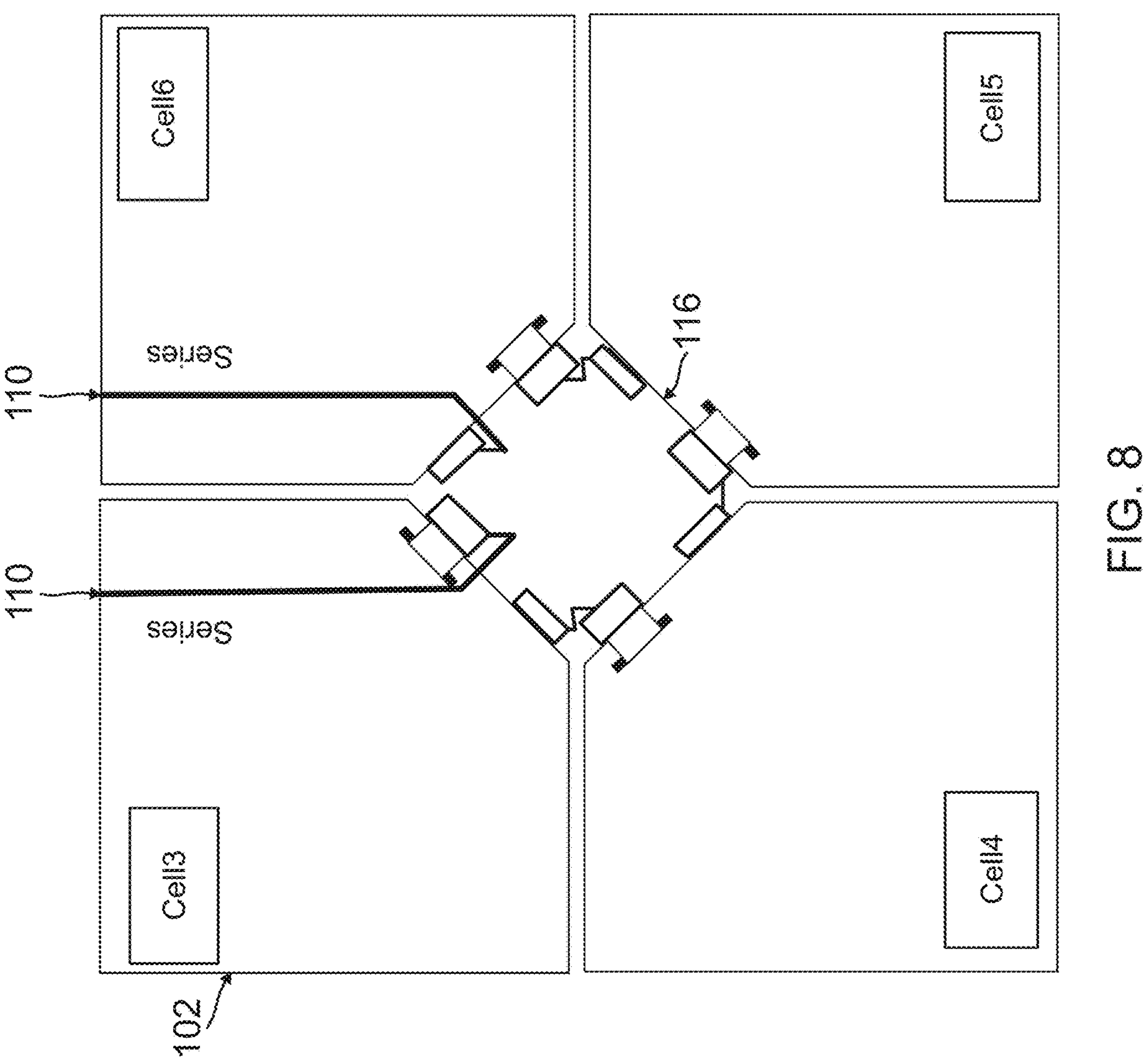
Figure 9:
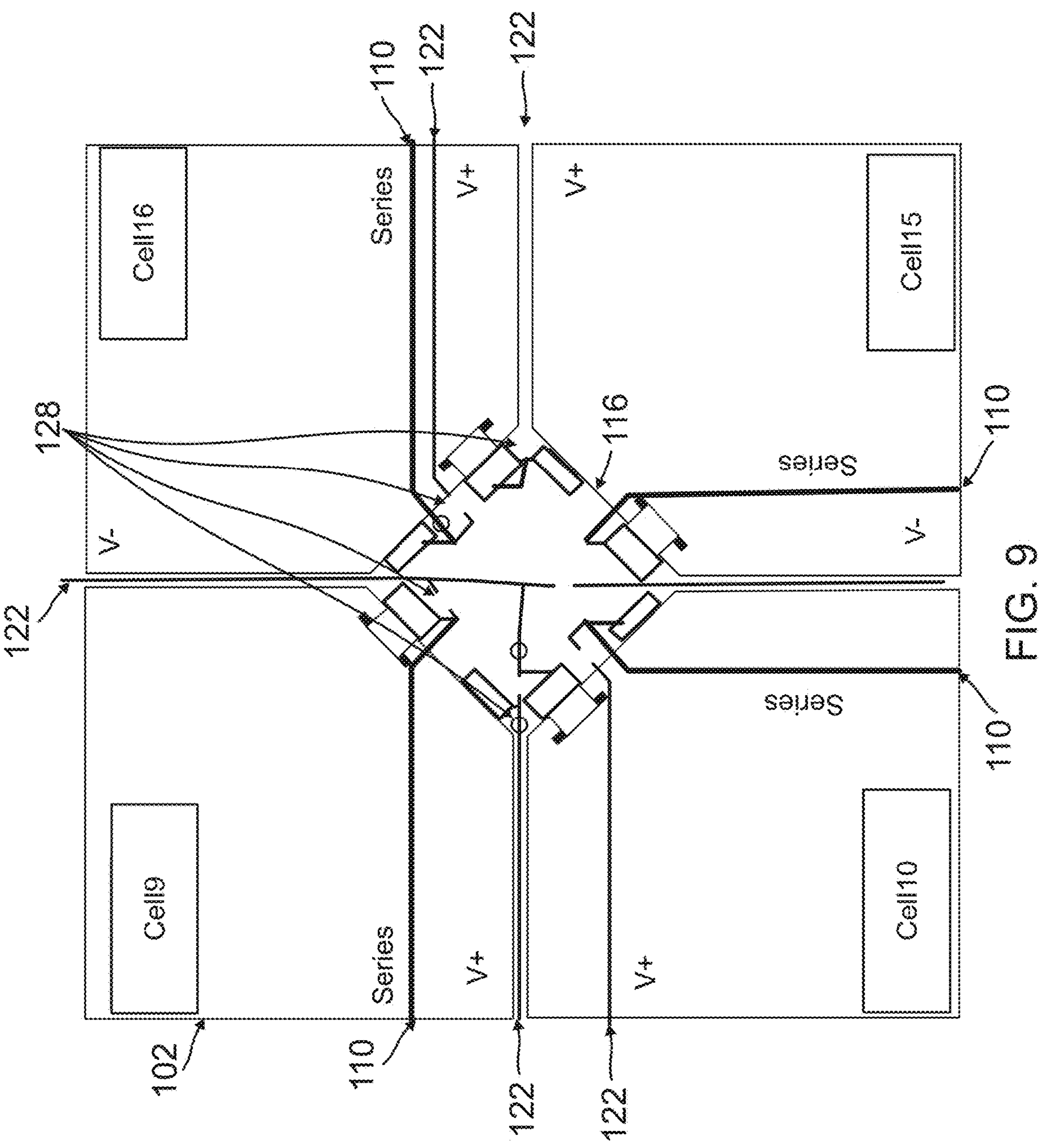
Figure 10:
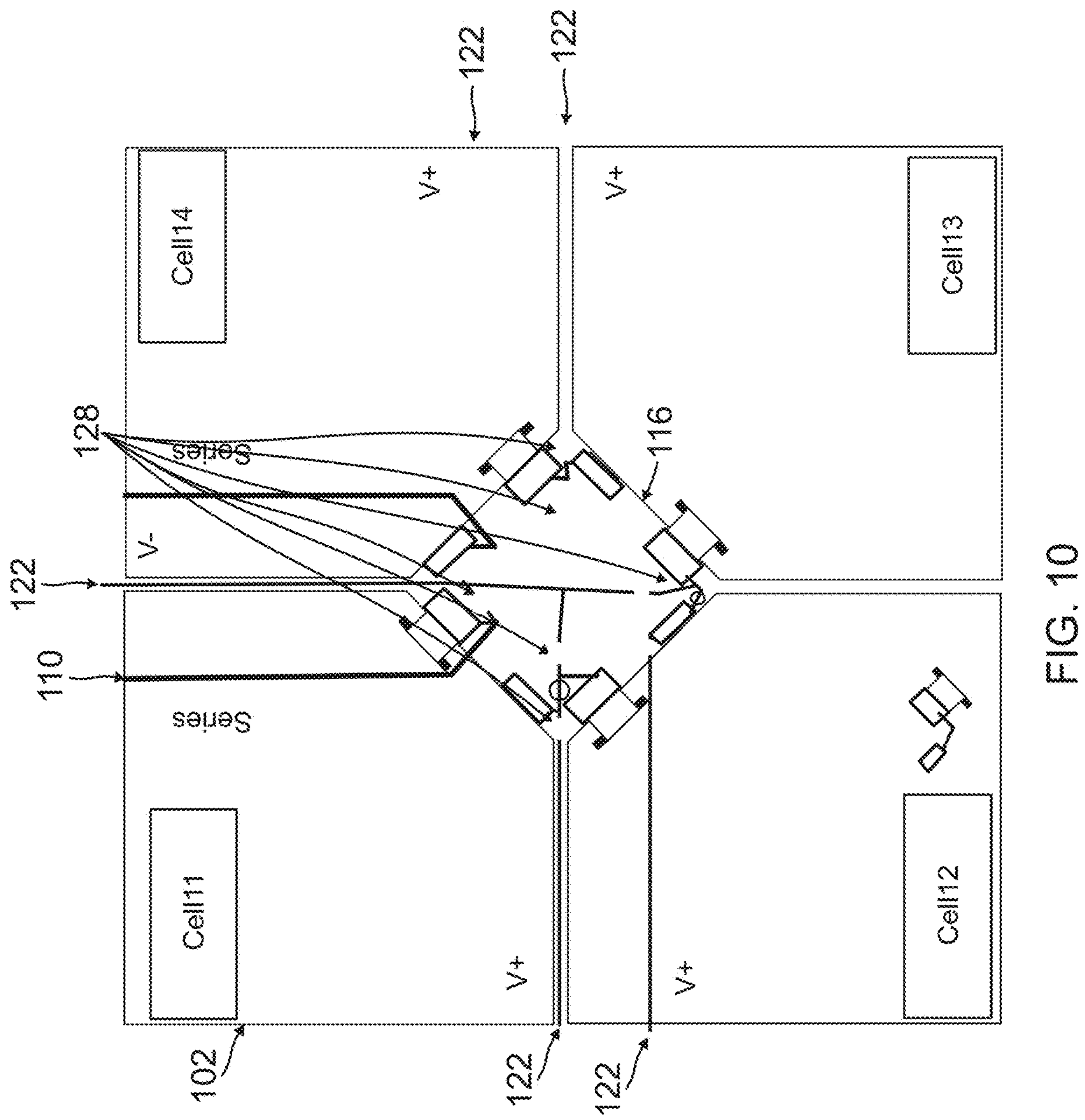
Figure 11:
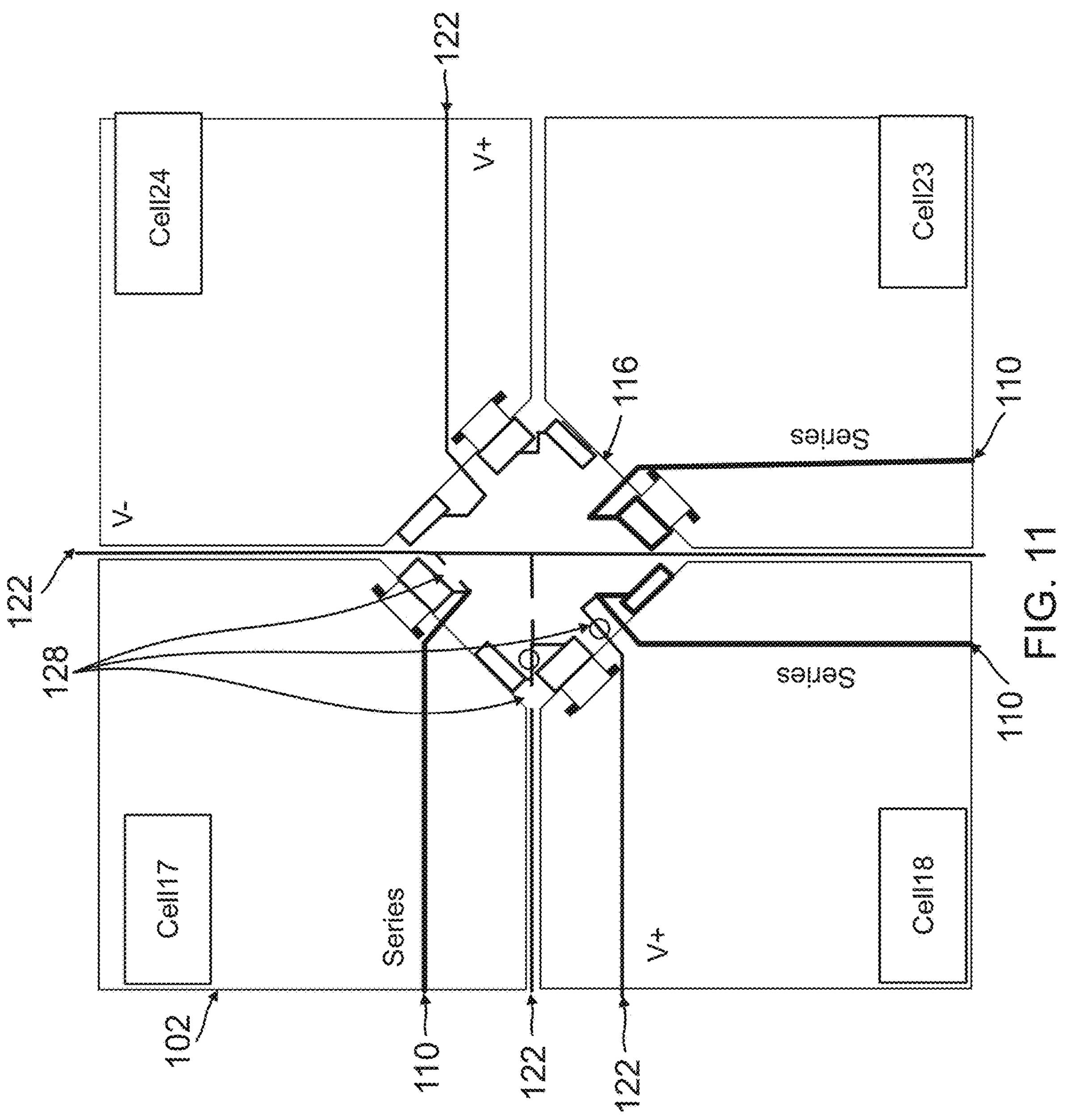
Figure 12:
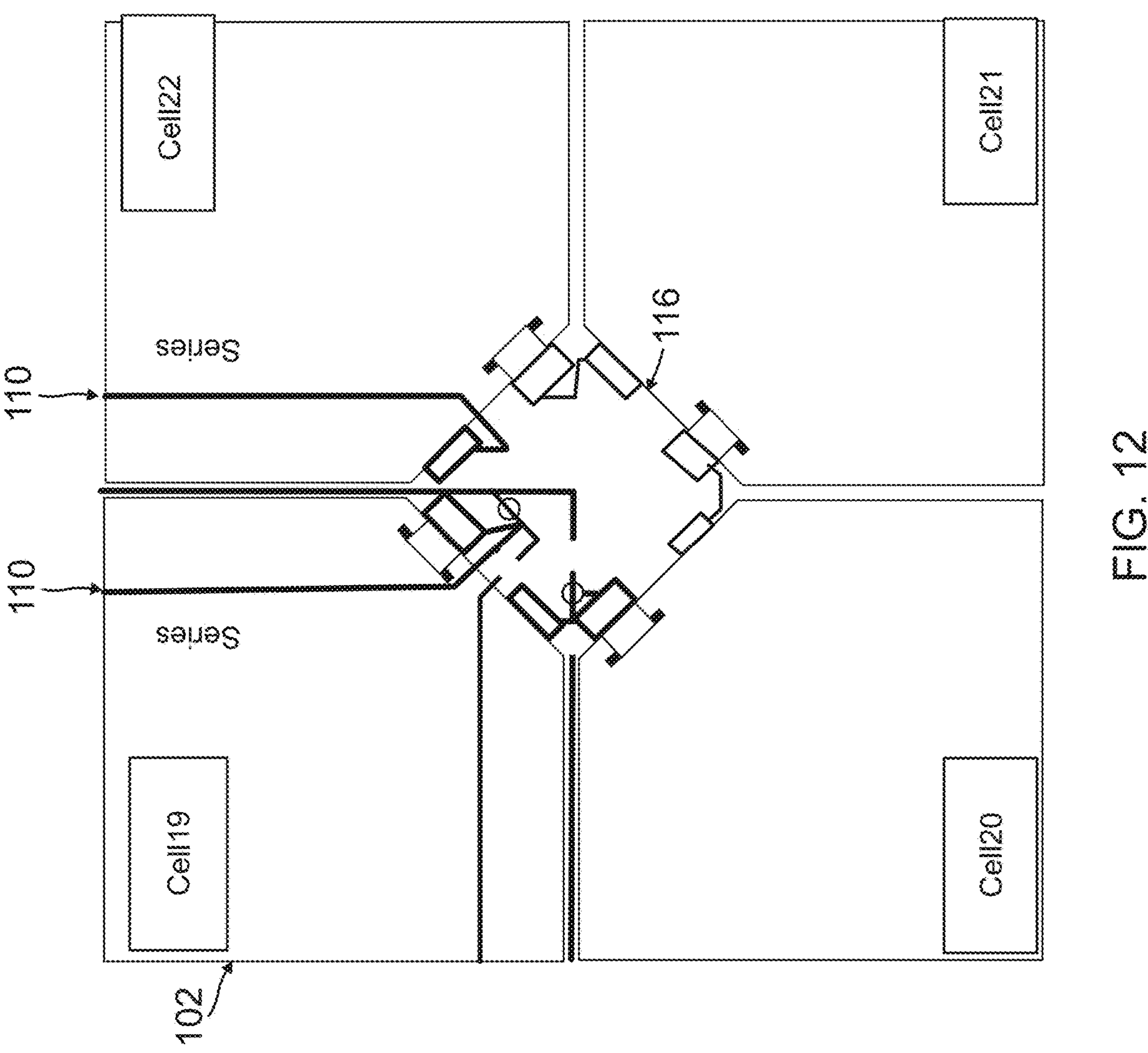

In the example of FIG. 6, the decision points 124 are set to create circuit lengths of 12 solar cells 102, which results in Cell1 being directly connected to V1− with series connections for each solar cell 102 in the circuit to Cell9. Cell1 to Cell8 are series connected without the ability to change. Between Cell8 and Cell24, there are decision points 124 where conductors 110, 122 can be broken to tailor the output voltage. The series connection between Cell 9 and Cell 10 is broken while these cells are connected to V1+ and V2− respectively. The decision points are set for series connection between cell 10 and Cell 18 for the second circuit. Between Cell 18 and Cell 19 the series connection is broken while these cells are connected to V2+ and V3− respectively. The decision points have Cell19 to Cell24 series connected. Cell24 is directly connected to V3+. Different selections of the decision points can change the end of first circuit from to any cell from Cell8 to Cell12. Similar can be set to adjust the length and output voltage of the second and third circuits.

FIGS. 7, 8, 9, 10, 11 and 12 provide additional detail of each corner region 116 indicating conductors 110, 122 in the corner region 116 and the discontinuities 128 made at decision points 124 to achieve the 12 solar cell 102 circuit length. These figures also highlight that bypass diodes have not been included in these illustrations, but would be desired in most applications.

In addition to circuit length customization the size of an array of solar cells 102 can also be customized, as demonstrated in FIG. 13. The array of solar cells 102 shown in FIG. 6 can be electrically reconfigured as shown in FIGS. 7, 8, 9, 10, 11 and 12. FIG. 13 shows how its length can also be adjusted. In this example, Cell13-Cell24 would be removed. The substrate 104 with the conductors 110, 122 could then be trimmed along the vertical dashed line to adjust its size and an overall quantity of the solar cells 102. Applying a sealing insulator to the edge over the exposed conductors 110, 122 may be desired, which can be accomplished with adhesive or a tape.

These examples demonstrate the design of a series of conducting paths 110, 122 integrated into a substrate 104 for attaching solar cells 102. The resulting solar panel 100 can be built and tested, which can take considerable time, and this assembly can then be stored. At some future time, panels 100 can be configured detailing the configuration of the decision points 124. For example, each decision point 124 could be a solid conductor 110, 122 and, once the decisions are made about the circuit topology, the conductors 110, 122 can be broken at the desired decision points 124. Conversely, the panels 100 could be made such that each decision point 124 is an open conductor 110, 122 and, at the decision point 124, another conductor 110, 122 can be added to bridge the open conductor 110, 122. The panel 100 can also be physically cut to the required length for the end user.

This manufacturing sequence allows for customization of the solar panel 100, testing, and delivery to be completed rapidly. Long delays of procurement, assembly, adhesive curing, and environmental testing to produce a solar panel 100 were completed earlier with material stored in inventory. Once a delivery is needed the customization can be completed in days instead of months. Inventory can always be built ahead of time and stored for immediate delivery, which is achievable for a single solar panel 100 item. However, missions are highly customized, and thus an inventory approach requires vast amounts of hardware of many circuit lengths and dimensions. This solar panel 100 design allows a single solar panel 100 to be inventoried and then, when needed, the solar panel 100 can be customized to the necessary size and configuration of output voltages for delivery in days.

The examples have used solar cells that are nearly square with a single cropped corner present. Solar cells can be more rectangular and have 2 or 4 cropped corners. Solar cells without cropped corners can be used, but they must be spaced apart to allow connections to be made. This routing of connections and ability to make physical and electrical configurations after assembly and test is independent of the solar cell shape. However, some of these solar cells will have multiple interconnects to either the n-type or p-type contacts. These multiple interconnects provide for redundancy and lower resistance paths. These can be utilized in this solar panel design by extending the traces to each interconnect of a common type.

The examples have used solar cells where the crop corners are aligned. For some cell geometries that may not be desirable. This is not a requirement of the solar panel layout. The flex circuit based wiring can be easily routed to reach the single or multiple interconnects of a solar cell wherever they may be.

Fabrication

Examples of the disclosure may be described in the context of a method 130 of fabricating a solar cell 102, a solar cell panel 100 comprised of a solar cell array, and/or a satellite, comprising steps 132-144, as shown in FIG. 14, wherein the resulting satellite 146 having a solar cell panel 100 comprised of an array of solar cells 102 are shown in FIG. 15.

As illustrated in FIG. 14, during pre-production, exemplary method 130 may include specification and design 132 of the solar cells 102, solar cell panel 100 and/or satellite 146, and material procurement 134 for same. During production, component and subassembly manufacturing 136 and system integration 138 of the solar cells 102, solar cell panel 100 and/or satellite 146 takes place, which include fabricating the solar cell 102, solar cell panel 100 and/or satellite 146. Thereafter, the solar cells 102, solar cell panel 100 and/or satellite 146 may go through certification and delivery 140 in order to be placed in service 142. The solar cells 102, solar cell panel 100 and/or satellite 146 may also be scheduled for maintenance and service 144 (which includes modification, reconfiguration, refurbishment, and so on), before being launched.

Each of the processes of method 130 may be performed or carried out by a system integrator, a third party, and/or an operator (e.g., a customer). For the purposes of this description, a system integrator may include without limitation any number of solar cell, solar cell panel, satellite or spacecraft manufacturers and major-system subcontractors; a third party may include without limitation any number of venders, subcontractors, and suppliers; and an operator may be a satellite company, military entity, service organization, and so on.

As shown in FIG. 15, a satellite 146 fabricated by exemplary method 130 may include systems 148, a body 150, a solar cell panel 100 comprised of an array of solar cells 102, and one or more antennae 152. Examples of the systems 148 included with the satellite 146 include, but are not limited to, one or more of a propulsion system 154, an electrical system 156, a communications system 158, and a power system 160. Any number of other systems 148 also may be included.

FIG. 16 is an illustration of the solar cell panel 100 in the form of a functional block diagram, according to one example. The solar cell panel 100 is comprised of an array of one or more of the solar cells 102 individually attached to the substrate 104, which includes one or more of the insulating layers 106, conductors 110, 122, and decision points 124. Each of the solar cells 102 absorbs light 162 from a light source 164 and generates an electrical output 166 in response thereto.

Conclusion

The description of the examples set forth above has been presented for purposes of illustration and description, and is not intended to be exhaustive or limited to the examples described. Many alternatives, modifications and variations may be used in place of the specific elements described above.

What is claimed is:

1. A method of configuring a solar cell array, comprising:

including a plurality of insulating layers and one or more conductive layers encapsulated by the insulating layers in a substrate;

attaching one or more solar cells to the substrate;

embedding the one or more conductive layers within the substrate, wherein the one or more conductive layers are patterned as conductors in prefabricated continuous conductive pathways for making electrical connections with the one or more solar cells, the prefabricated continuous conductive pathways including traces, a first insulating layer from the plurality of insulating layers connected by a first adhesive to a first conductive layer from the one or more conductive layers, the first conductive layer directly connected to a second insulating layer from the plurality of insulating layers, the second insulating layer directly connected to a second conductive layer from the one or more conductive layers, the second conductive layer connected by a second adhesive to a third insulating layer, the third insulating layer connected by a third adhesive to the one or more solar cells;

associating one or more decision points with the traces in the substrate; and cutting the traces at the one or more decision points to create a gap or discontinuity in the prefabricated continuous conductive pathways based on a desired configuration of the prefabricated continuous conductive pathways, the traces becoming extraneous to the electrical continuity after the electrical continuity is broken.

2. The method of claim 1, wherein the substrate is a pre-fabricated flex circuit comprising the prefabricated continuous conductive pathways.

3. The method of claim 2, wherein:

at least one of the one or more solar cells has at least one cropped corner that defines a corner region;

an area of the pre-fabricated flex circuit remains exposed when the one or more solar cells having the cropped corner that defines the corner region are attached to the pre-fabricated flex circuit; and the electrical connections between the one or more solar cells and the conductors are made using interconnects in the corner region on or in the area of the pre-fabricated flex circuit that remains exposed.

4. The method of claim 3, wherein ends of the conductors are aligned and exposed through a surface of the pre-fabricated flex circuit in the area of the pre-fabricated flex circuit that remains exposed, in order to electrically connect to the interconnects.

5. The method of claim 3, wherein the conductors on multiple layers of the pre-fabricated flex circuit are connected using vias in the pre-fabricated flex circuit.

6. The method of claim 1, further comprising removing electrical continuity to the conductors using the one or more decision points to define a series configuration of the one or more solar cells, a parallel configuration of the one or more solar cells, or both a parallel and series configuration of the one or more solar cells.

7. The method of claim 1, wherein at least some of the conductors are series connections for the one or more solar cells.

8. The method of claim 1, wherein at least some of the conductors are circuit terminations for the one or more solar cells.

9. The method of claim 1, wherein at least some of the conductors are connected together at their crossing points.

10. The method of claim 1, wherein at least some of the conductors are patterned in separate conductive metal layers in the substrate.

11. The method of claim 1, wherein at least some of the conductors are formed in one metal layer in the substrate.

12. The method of claim 1, wherein the one or more decision points are used to customize a circuit length for the solar cell array.

13. The method of claim 1, wherein the substrate is trimmed to adjust its size and an overall quantity of the one or more solar cells.

14. The method of claim 1, wherein the traces are cut by removing an interconnect or triggering a fuse.

15. A solar cell array, comprising:

a substrate including a plurality of insulating layers and one or more conductive layers encapsulated by the insulating layers and embedded within the substrate, wherein the one or more conductive layers are patterned as conductors in prefabricated continuous conductive pathways for making electrical connections with one or more solar cells, first insulating layer from the plurality of insulating layers connected by a first adhesive to a first conductive layer from the one or more conductive layers, the first conductive layer directly connected to a second insulating layer from the plurality of insulating layers, the second insulating layer directly connected to a second conductive layer from the one or more conductive layers, the second conductive layer connected by a second adhesive to a third insulating layer, the third insulating layer connected by a third adhesive to the one or more solar cells;

the one or more solar cells attached to the substrate; traces included in the prefabricated continuous conductive pathways; and one or more decision points associated with the traces in the substrate, wherein the traces are cut at the one or more decision points to create a gap or discontinuity in the prefabricated continuous conductive pathways based on a desired configuration of the prefabricated continuous conductive pathways, the traces becoming extraneous to the electrical continuity after the electrical continuity is broken.

16. The solar cell array of claim 15, further comprising removing electrical continuity to the conductors using the one or more decision points to define a series configuration of the one or more solar cells, a parallel configuration of the one or more solar cells, or both a parallel and series configuration of the one or more solar cells.

17. The solar cell array of claim 15, wherein the one or more decision points are used to customize a circuit length for the solar cell array.

18. The solar cell array of claim 15, wherein the substrate is trimmed to adjust a length of the one or more solar cells.

19. The solar cell array of claim 15, wherein the traces are cut by removing an interconnect or triggering a fuse.

* * * * *